(12) United States Patent
Maeda et al.

(10) Patent No.: US 10,790,277 B2
(45) Date of Patent: Sep. 29, 2020

(54) SEMICONDUCTOR DEVICE

(71) Applicant: Renesas Electronics Corporation, Tokyo (JP)

(72) Inventors: Satoshi Maeda, Kodaira (JP);
Yasuyuki Morishita, Kodaira (JP);
Masanori Tanaka, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 521 days.

(21) Appl. No.: 15/553,138

(22) PCT Filed: Jun. 19, 2015

(86) PCT No.: PCT/JP2015/067766
§ 371 (c)(1),
(2) Date: Aug. 23, 2017

(87) PCT Pub. No.: WO2016/203648
PCT Pub. Date: Dec. 22, 2016

(65) Prior Publication Data
US 2018/0040609 A1     Feb. 8, 2018

(51) Int. Cl.
*H02H 9/00* (2006.01)
*H01L 27/02* (2006.01)
(Continued)

(52) U.S. Cl.
CPC ........ *H01L 27/0296* (2013.01); *H01L 21/822* (2013.01); *H01L 23/50* (2013.01);
(Continued)

(58) Field of Classification Search
None
See application file for complete search history.

(56) References Cited

U.S. PATENT DOCUMENTS 7,911,752 B1 *   3/2011   Lin ........................ H02H 9/046
                                                           361/56
8,035,188 B2   10/2011   Segawa et al.
(Continued)

FOREIGN PATENT DOCUMENTS

JP    H 06-89973 A     3/1994
JP    2003-530698 A   10/2003
(Continued)

OTHER PUBLICATIONS

Extended European Seach Report dated Jan. 2, 2019 for European Patent Application No. 15895668.0-1230.
(Continued)

*Primary Examiner* — Stephen W Jackson
(74) *Attorney, Agent, or Firm* — McGinn IP Law Group, PLLC

(57) ABSTRACT

A semiconductor device provided with: a first input/output circuit connected to a first pad; a second input/output circuit disposed in the direction along one side constituted by a chip edge in relation to the first input/output circuit, the second input/output circuit being connected to a second pad; and an ESD protective circuit disposed near the outer-side chip edge of the first and second input/output circuits. The ESD protection circuit is provided with a resistor, a capacitor, an inverter, and an N-channel-type transistor.

20 Claims, 26 Drawing Sheets

(51) Int. Cl.
 H01L 21/822 (2006.01)
 H01L 27/04 (2006.01)
 H01L 23/50 (2006.01)
 H01L 23/528 (2006.01)
(52) U.S. Cl.
 CPC ...... *H01L 23/5286* (2013.01); *H01L 27/0266* (2013.01); *H01L 27/0288* (2013.01); *H01L 27/04* (2013.01)

(56) References Cited

U.S. PATENT DOCUMENTS

| | | |
|---|---|---|
| 2009/0303645 A1 | 12/2009 | Sasaki |
| 2009/0323236 A1 | 12/2009 | Morishita |
| 2013/0093508 A1 | 4/2013 | Sakamoto et al. |
| 2013/0264647 A1* | 10/2013 | Toba .................. H01L 27/0207 |
| | | 257/355 |

FOREIGN PATENT DOCUMENTS

| | | |
|---|---|---|
| JP | 2005-536046 A | 11/2005 |
| JP | WO2006/011292 A1 | 5/2008 |
| JP | 2013-021249 A | 1/2013 |
| JP | 2013-183107 A | 9/2013 |
| WO | WO 2004/015776 A2 | 2/2004 |
| WO | WO 2014/188514 A1 | 11/2014 |

OTHER PUBLICATIONS

Internation Search Report (ISR) (PCT Form PCT/ISA/210), in PCT/JP2015/067766, dated Aug. 4, 2015.

* cited by examiner

F I G . 4
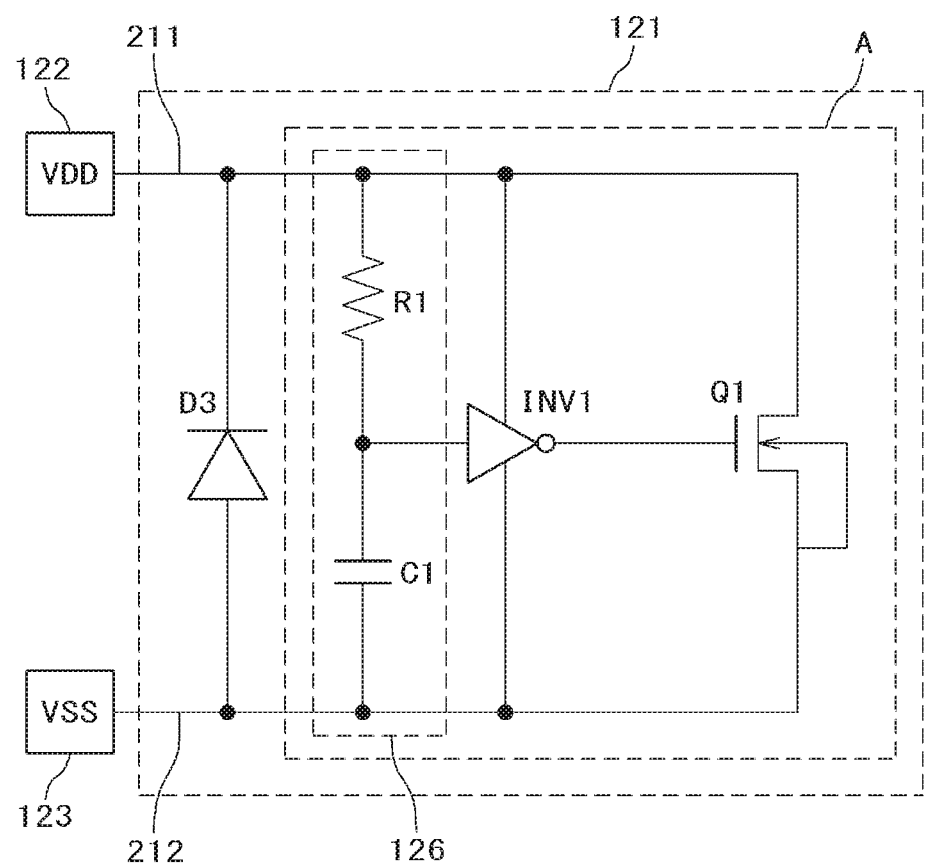

SEMICONDUCTOR DEVICE

TECHNICAL FIELD

The present disclosure relates to a semiconductor device and is applicable to, for example, a semiconductor device having an ESD (Electro-Static-Discharge) protection circuit.

BACKGROUND ART

In a chip peripheral area of a semiconductor integrated circuit device (LSI chip), a plurality of input/output cells corresponding to a plurality of external terminals are disposed. A plurality of power supply cells are disposed for the input/output cells for power supply impedance reduction, stabilization, and the like. An ESD protection circuit is included in the input/output cells and the power supply cells. Prior-art literatures related to the present disclosure include, for example, Published Japanese Translation of PCT International Publication for Patent Application No. 2005-536046 or International Publication No. 2004/015776 corresponding thereto.

CITATION LIST

Patent Literature

PTL 1: Published Japanese Translation of PCT International Publication for Patent Application No. 2005-536046
PTL 2: International Publication No. 2004/015776

SUMMARY OF INVENTION

Technical Problem

As the functions of products and numbers of separated power supply domains are increased, power supply cells (ESD protection circuits) to be disposed have been increased in number, increasing chip areas.

Other problems and novel features will be apparent from the description in this specification and accompanying drawings.

Solution to Problem

The overview of a representative element of the present disclosure is briefly described as follows:

A semiconductor device is provided outside input/output cells with ESD protection circuits long in the direction of arrangement of the input/output cells. Each ESD protection circuit is made up of a resistor, a capacitor, an inverter, and an N-channel transistor.

Advantageous Effects of Invention

According to the above semiconductor device, increase in chip area can be suppressed.

BRIEF DESCRIPTION OF DRAWINGS

FIG. 4 is a circuit diagram of a power supply cell in FIG. 2;
FIG. 19 is a layout diagram of FIG. 18 with the pads seen through.

DESCRIPTION OF EMBODIMENTS

Figure 1:
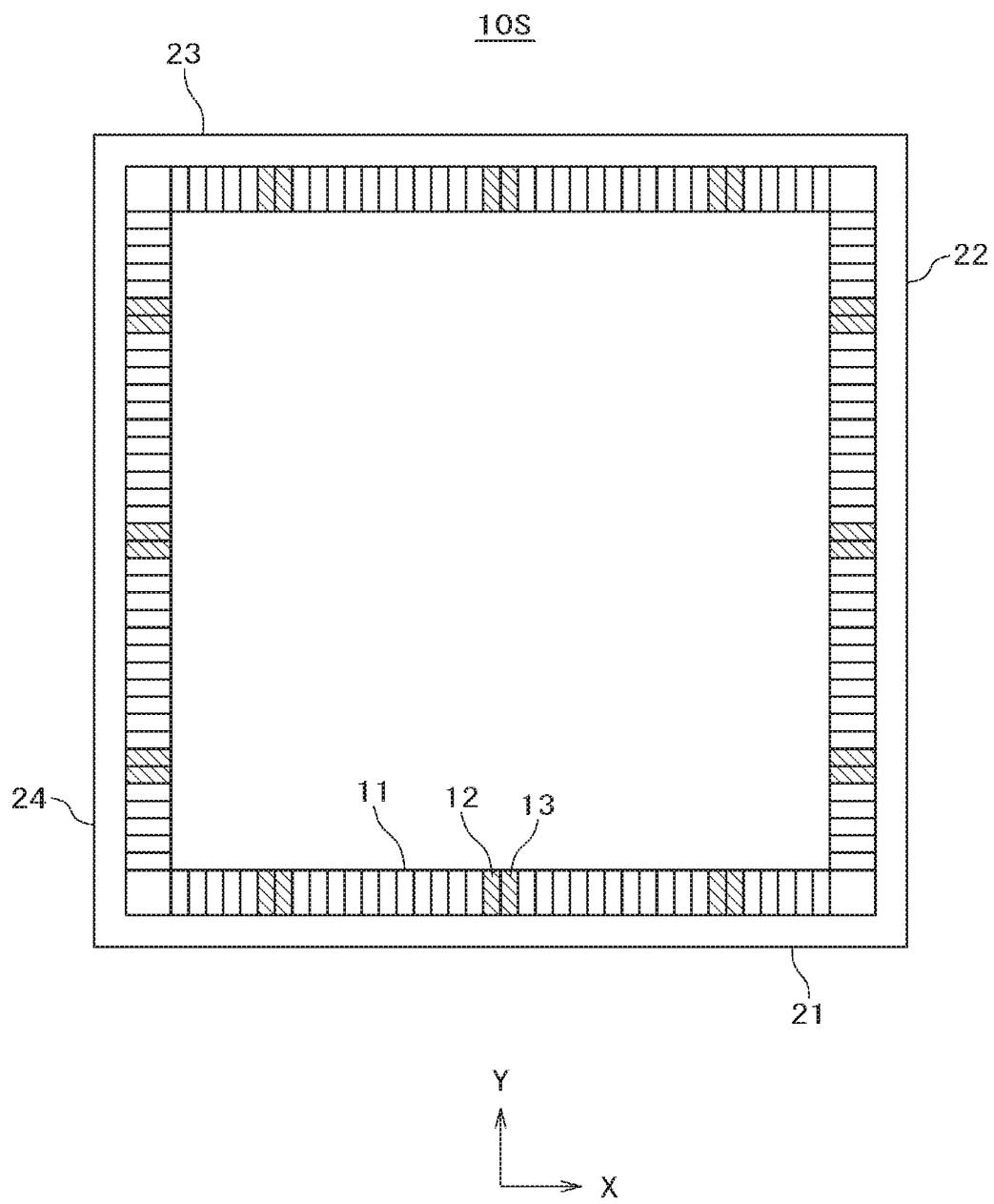
FIG. 1 is a schematic layout diagram of a semiconductor device in a comparative example.

Hereafter, a description will be given to an embodiment, examples, and modifications with reference to the drawings. However, in the following description, identical constituent elements will be marked with identical reference numerals and a repetitive description thereof may be omitted. Drawings may be schematically depicted with respect to the width, thickness, shape, and the like of each part as compared with actual configurations for making the description clearer and these drawings are merely for exemplification and are not intended to limit the interpretation of the present invention.

A description will be given to a semiconductor device related to a technology (hereafter, referred to as comparative example) investigated by the present inventor prior to the present disclosure.

FIG. 1 is a plan view illustrating a schematic layout of a semiconductor device in the comparative example. The semiconductor device 10S is provided in the peripheral portion of a chip with input/output cells 11 and power supply cells 12, 13. The regions where input/output cells 11 and power supply cells 12, 13 are disposed are referred to as IO regions. The IO regions are in proximity to chip ends 21, 22, 23, 24 and are along the four sides constituted by the chip ends 21, 22, 23, 24 as planarly viewed. Two sides constituted by the chip ends 21, 23 are extended along the X direction. Two sides constituted by the chip ends 22, 24 are extended along the Y direction. Each input/output cell 11 is a region for forming an input/output circuit connected to one input/output pad. Each power supply cell 12, 13 is a region for forming an ESD protection circuit protecting the semiconductor device from ESD and noise and wirings supplying power or GND (ground potential) to the interior of the chip. Since it is required to evenly reduce power supply impedance, the power supply cells 12, 13 are dispersedly disposed at intervals of a plurality of input/output cells 11 and are adjacently placed between an input/output cell 11 and an input/output cell 11. The semiconductor device 10S has one power supply domain but the power supply cells 12, 13 are placed three by three for an IO region opposed to one chip side.

Figure 2:
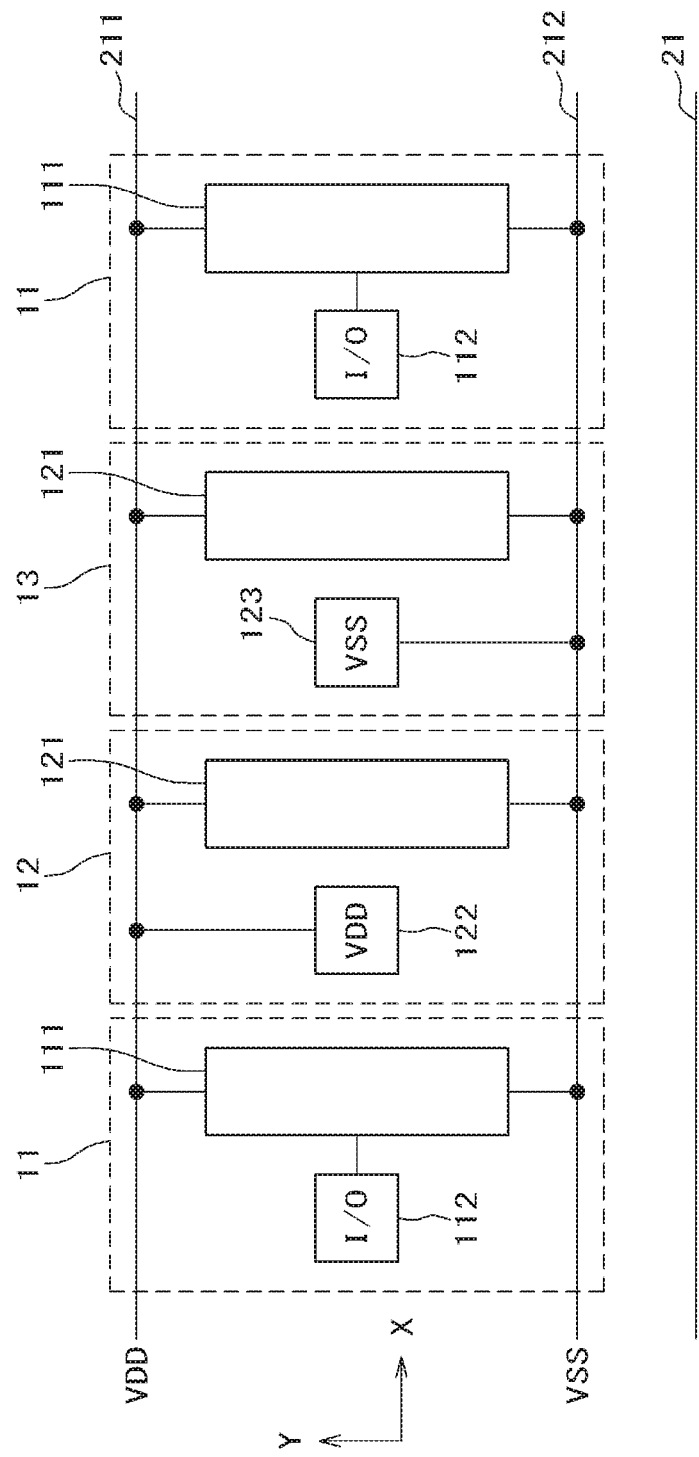
FIG. 2 is a block diagram of an IO region in FIG. 1.

FIG. 2 is a block diagram of an IO region in FIG. 1 and illustrates the relation of connection between power supply cells and input/output cells and power supply. The input/output cells 11 include an input/output circuit 111 connected to an input/output terminal (I/O) 112. The power supply cells 12 are provided with an ESD protection circuit 121 corresponding to a power supply terminal (VDD) 122 and the power supply cells 13 are provided with an ESD protection circuit 121 corresponding to a grounding terminal (VSS) 123. The input/output terminals 112, the power supply terminals 122, and the grounding terminals 123 are respectively disposed over input/output cells 11 and power supply cells 12, 13 but may be respectively disposed away from input/output cells 11 and power supply cells 12, 13. The input/output terminals 112, the power supply terminals 122, and the grounding terminals 123 are connected to a bonding pad or the like and respectively also referred to as input/output pad, power supply pad, and ground pad.

Figure 3:
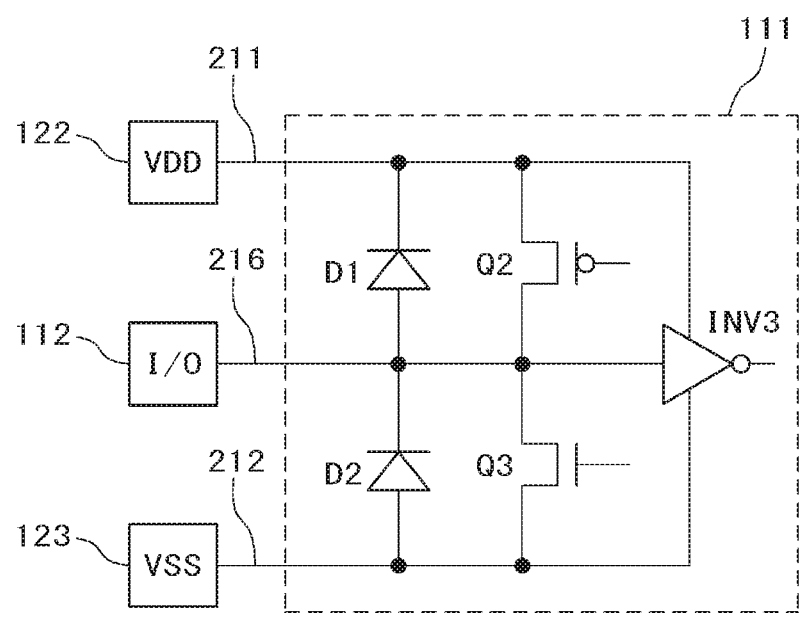
FIG. 3 is a circuit diagram of an input/output cell in FIG. 2.

FIG. 3 is a circuit diagram of an input/output cell in FIG. 2. An input/output circuit 111 constituting the input/output cell 11 is provided with: an output circuit including a P-channel transistor Q2 and an N-channel transistor Q3 conveying output signals to a signal wiring 216 connected to an input/output terminal 112; an input circuit INV3 including an inverter INV1 receiving input signals inputted from the input/output terminal 112 via the signal wiring 216; and diodes D1, D2 constituting an ESD protection circuit. The P-channel transistor Q2 is connected between a power supply wiring 211 and the signal wiring 216; the N-channel transistor Q3 is connected between the signal wiring 216 and a grounding wire 212; and the inverter INV3 is connected between the power supply wiring 211 and the grounding wire 212. The anode of the diode D1 is connected to the signal wiring 216 and the cathode thereof is connected to the power supply wiring 211. The anode of the diode D2 is connected to the grounding wire 212 and the cathode thereof is connected to the signal wiring 216. The diode D1 lets through a surge current going from the input/output terminal 112 toward the power supply terminal 122 via the signal wiring 216 and the power supply wiring 211; and the diode D2 lets through a surge current going from the grounding terminal 123 toward the input/output terminal 112 via the grounding wire 212 and the signal wiring 216. The output circuit may be of a so-called open drain type not provided with the P-channel transistor Q2. The input/output circuit may be not provided with either an output circuit or an input circuit.

FIG. 4 is a circuit diagram of a power supply cell in FIG. 2. An ESD protection circuit 121 constituting the power supply cell 12, 13 is made up of: a time constant circuit (also referred to as RC timer) 126 detecting a positive surge voltage; an inverter INV1 as a buffer circuit; an N-channel transistor Q1 increased in size in order to discharge such a surge voltage at high speed; and a diode D3. The RC timer 126 is formed of an integration circuit made up of a resistor R1 and a capacitor C1. One end of the resistor R1 is connected to a power supply terminal 122 via a power supply wiring 211 and the other end thereof is connected to one end of the capacitor C1 and to the input of the inverter INV1. One end of the capacitor C1 is connected to the other end of the resistor R1 and to the input of the inverter INV1 and the other end thereof is connected to a grounding terminal 123 via a grounding wire 212. The charge voltage of the capacitor C1 is supplied to the input terminal of the inverter INV1. The output of the inverter INV1 is connected to the gate of the N-channel transistor Q1. The inverter INV1 operates on an operating voltage received from the power supply terminal 122 via the power supply wiring 211. The drain of the N-channel transistor Q1 is connected to the power supply terminal 122 via the power supply wiring 211; the source thereof is connected to the grounding terminal 123 via the grounding wire 212; and the back gate thereof is connected to the grounding terminal 123 via the grounding wire 212. Between the power supply terminal 122 and the grounding terminal 123, a diode D3 is provided for discharging a negative surge voltage. The anode of the diode D3 is connected to the grounding wire 212 and the cathode thereof is connected to the power supply wiring 211. The diode D3 lets through a surge current such that the surge current goes from the grounding terminal 123 toward the power supply terminal 122 via the grounding wire 212 and the power supply wiring 211.

For example, when a positive surge voltage is generated at the power supply terminal 122, the inverter INV1 is supplied with an operating voltage from the power supply terminal 122 and a high level corresponding to the surge voltage is conveyed in delay to the input terminal of the inverter INV1 by the time constant circuit 126. Therefore, during a period from when the positive surge voltage is generated at the power supply terminal 122 to when the charge voltage of the capacitor C1 reaches a logical threshold voltage of the inverter circuit INV1, the inverter INV1 is kept at a high level and the N-channel transistor Q1 is kept on, thereby discharging the surge voltage.

Each of the inverters INV1, INV3 is made up of a P-channel transistor and an N-channel transistor. Each of the P-channel transistor Q2, the N-channel transistors Q1, Q3 and the P-channel transistors and N-channel transistors of the inverters INV1, INV3 is a so-called MOSFET; however, the material of their gates is not limited to metal and their gate insulating films are not limited to an oxide film, either.

Figure 5:
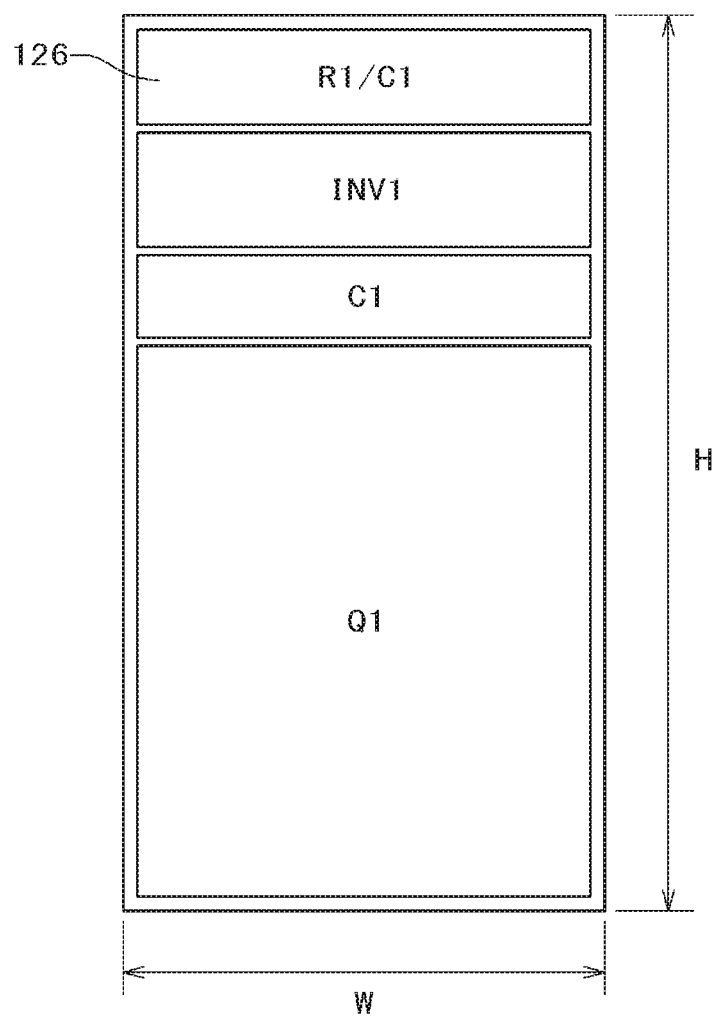
FIG. 5 is a layout diagram of the ESD protection circuit encircled with broken line A in FIG. 4.

FIG. 5 is a layout diagram of the ESD protection circuit encircled with broken line A in FIG. 4 and is matched with the orientation of the power supply cells disposed on the lower (chip end 21) side in FIG. 1. An N-channel transistor Q1, an inverter INV1, and an RC timer 126 are arranged in this order from the chip end side. Like the input/output cells 11, the power supply cells 12, 13 are shorter in the X direction (cell width (W)) than in the Y direction (cell height (H)).

Figure 6:
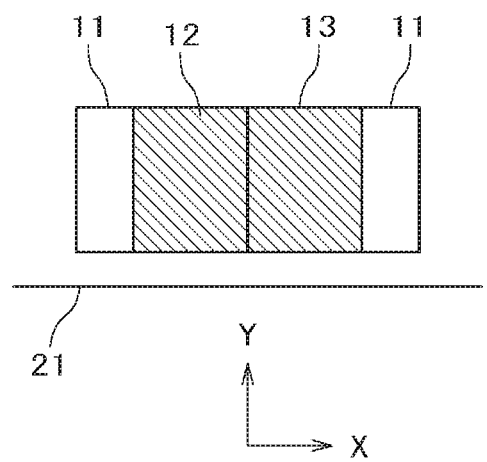
FIG. 6 is a schematic layout diagram of a first example of an IO region in FIG. 1.
Figure 7:
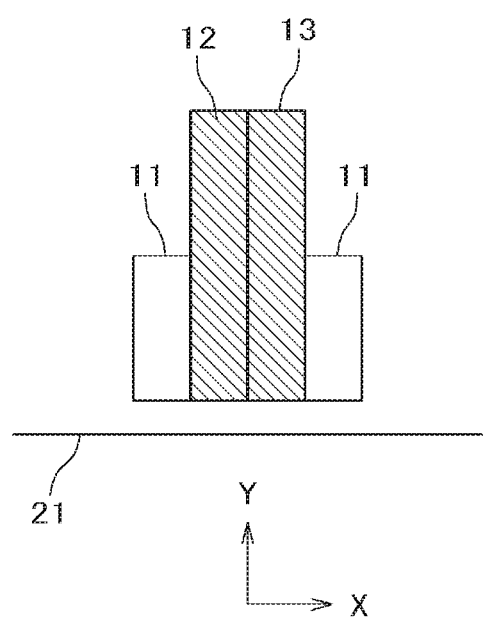
FIG. 7 is a schematic layout diagram of a second example of an IO region in FIG. 1.

FIG. 6 is a schematic layout diagram of a first example of an IO region in FIG. 1 and illustrates a case where the height of power supply cells is matched with the height of input/output cells. FIG. 7 is a schematic layout diagram of a second example of an IO region in FIG. 1 and illustrates a case where the width of power supply cells is matched with the width of input/output cells. The power supply cells 12, 13 are inevitably larger in size than the input/output cells 11. As a result, the input/output cells 11 and power supply cells 12, 13 different in size are disposed together.

As the functions of products and numbers of separated power supply domains are increased, ESD protection circuits (power supply cells) to be disposed are increased in number. Further, chip areas are increased due to increase in pin count (input/output pad neck). Since circling wirings, such as the power supply wirings and grounding wires of IO regions, have resistance, it is necessary to place an ESD protection circuit. However, because of the input/output pad neck, it is also necessary to place an ESD protection circuit, which should be essentially placed in an IO region, inside an IO region. As a result, however, the design is more complicated due to pressure from a chip internal region, connection of an IO region with a circling wiring, production of projections and depressions, and the like. Since the wiring resistance of circling wirings is increased with movement of processes toward finer design rules, chip areas are increased because of increase in the number of ESD protection circuits that should be taken into account, increase in the number of wiring regions, and the like. Power supply cells including an ESD protection circuit is larger in size than input/output cells and their cell width is increased when their cell height is matched with the cell height of input/output cells. Some input/output cells are large in cell size because of their specifications and a portion protruded from an IO region (projections and depressions) is produced when their cell width is matched with the cell width of other input/output cells.

Embodiment

A description will be given to a semiconductor device in an embodiment to solve a problem related to the semiconductor device in the comparative example.

Figure 8:
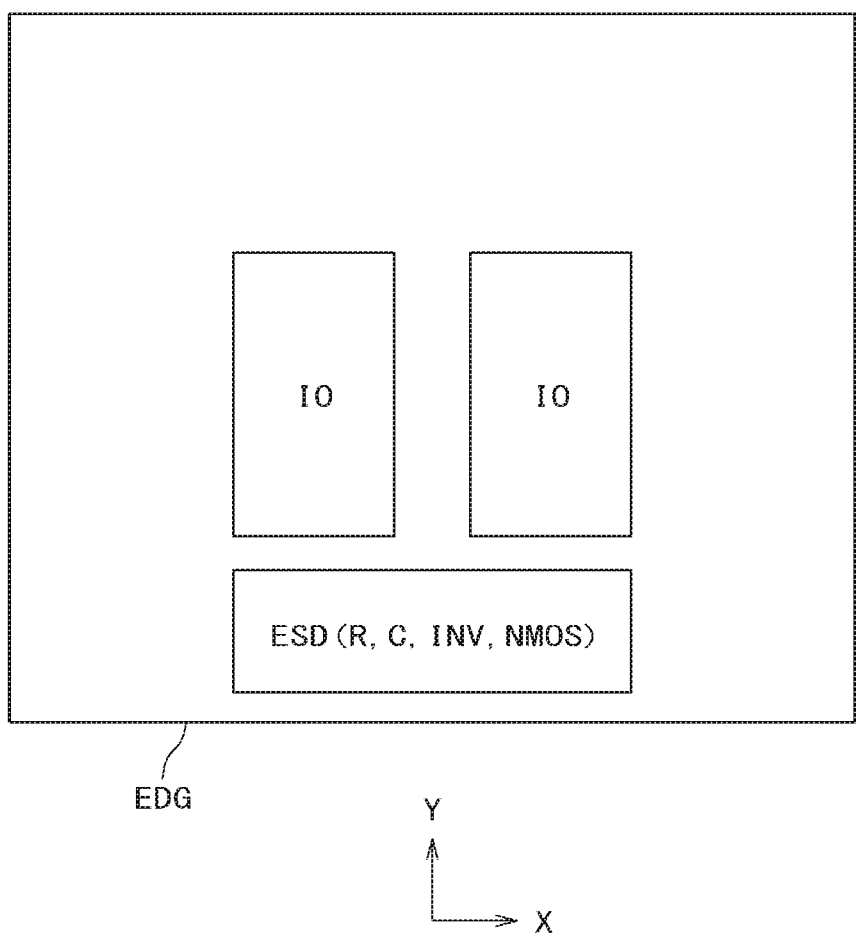
FIG. 8 is a drawing explaining a semiconductor device in an embodiment.

FIG. 8 is a layout diagram illustrating a configuration of a semiconductor device in an embodiment. The semiconductor device 10 includes: a plurality of input/output circuits (IO) serially arranged in the X direction; and an ESD protection circuit (ESD) placed outside the input/output circuits (IO) (chip end (EDG) side). The ESD protection circuit (ESD) includes a resistor (R), a capacitor (C), an inverter (INV), and an N-channel transistor (NMOS).

Since the ESD protection circuit larger than the input/output circuits is not placed on the input/output circuit row, increase in chip area can be suppressed.

Example 1

Figure 9:
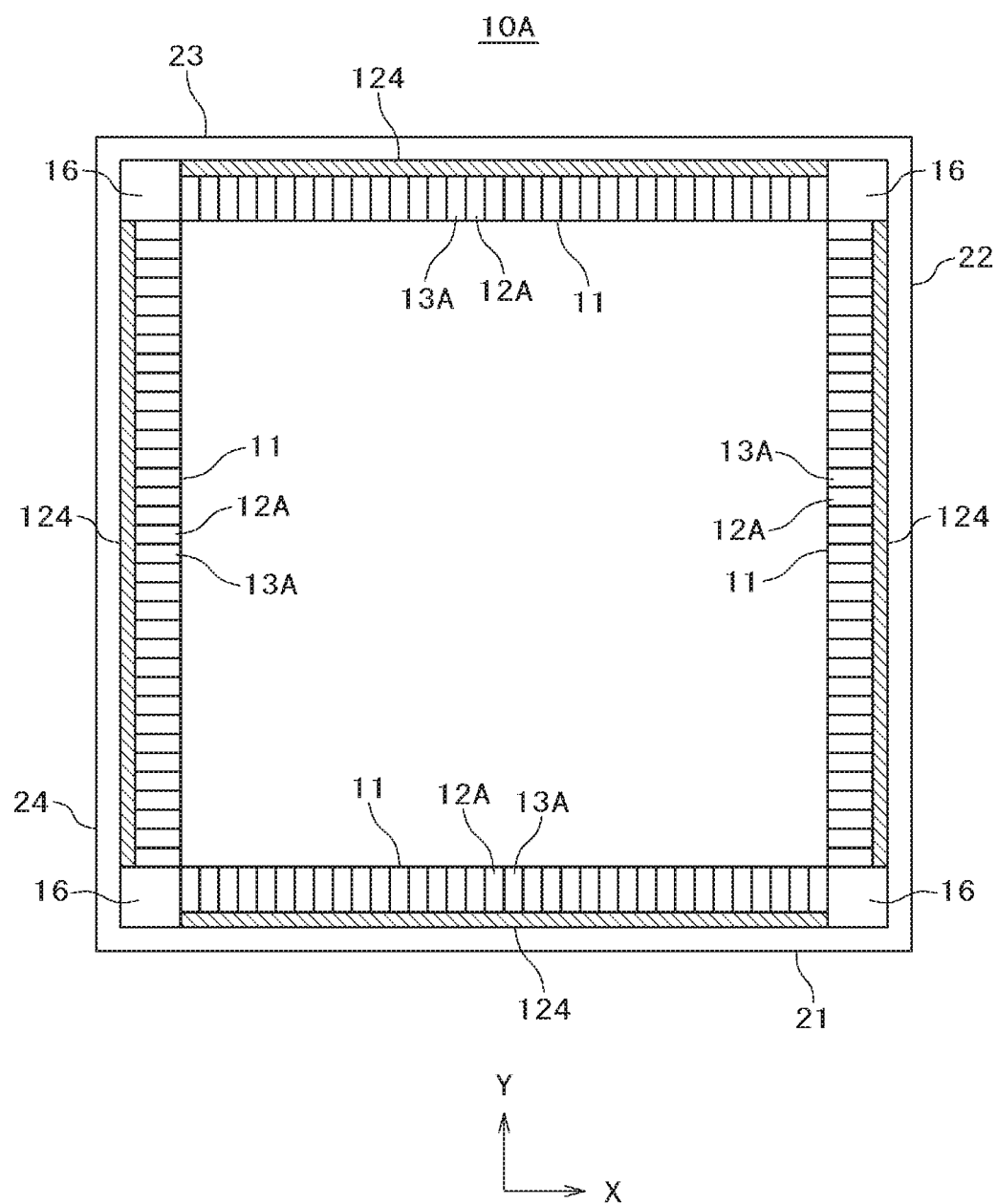
FIG. 9 is a schematic layout diagram of a semiconductor device in Example 1.

FIG. 9 is a plan view illustrating a schematic layout of a semiconductor device in Example 1. The semiconductor device 10A is provided on the periphery of a chip formed of a single semiconductor substrate with input/output cells 11 and power supply cells 12A, 13A. The regions where input/output cells 11 and power supply cells 12A, 13A are disposed are referred to as IO regions. The IO regions are in proximity to the chip ends 21, 22, 23, 24 and along the four sides constituting the chip ends 21, 22, 23, 24 as planarly viewed. Two sides constituted by the chip ends 21, 23 are extended along the X direction. Two sides constituted by the chip ends 22, 24 are extended along the Y direction. Each input/output cell 11 is a region for forming an input/output circuit connected to one input/output pad. Each power supply cell 12A, 13A is a region for forming a diode D3 protecting the semiconductor device from ESD and noise and wirings supplying power or GND (ground potential) to the interior of the chip. Since it is required to evenly reduce power supply impedance, the power supply cells 12A, 13A are dispersedly disposed at intervals of a plurality of input/output cells 11 and are adjacently placed between an input/output cell 11 and an input/output cell 11. The ESD protection circuits 124 are disposed outside the input/output cell 11 and the power supply cells 12A, 13A (the chip end 21, 22, 23, 24 side) in proximity to these cells and are respectively extended along the four sides at the chip ends. A corner cell 16 is provided at the four corners of the chip of the semiconductor device 10A. Each corner cell 16 is provided with a power supply wiring and a grounding wire. The semiconductor device 10A is provided inside the IO regions with an internal circuit. Like the semiconductor device 10S, the semiconductor device 10A has one power supply domain and the power supply cells 12A, 13A are disposed in one place in each IO region along the chip sides. The number of power supply cells 12A, 13A placed is not limited to the foregoing and defined according to the discharging property of protection elements, wiring impedance, and the like in each semiconductor technology. The number of power supply cells 12A, 13A placed in the semiconductor device 10A can be made smaller than the number of power supply cells 12, 13 placed in the semiconductor device 10S as long as the semiconductor device 10A is equivalent to the semiconductor device 10S except the power supply cells and the ESD protection circuits. This makes it possible to contribute to pad neck elimination.

Figure 10:
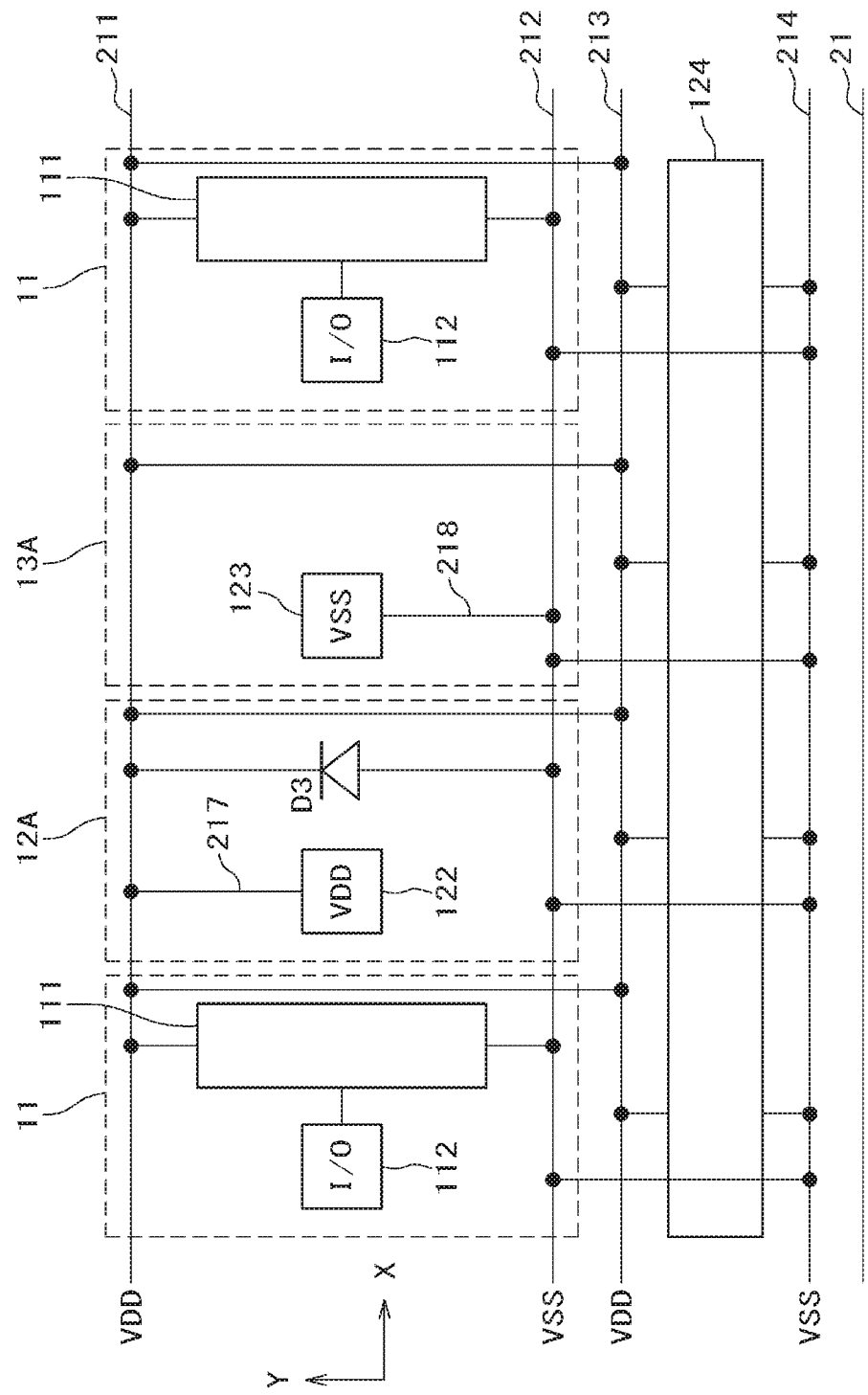
FIG. 10 is a block diagram of an IO region in FIG. 9.
Figure 11:
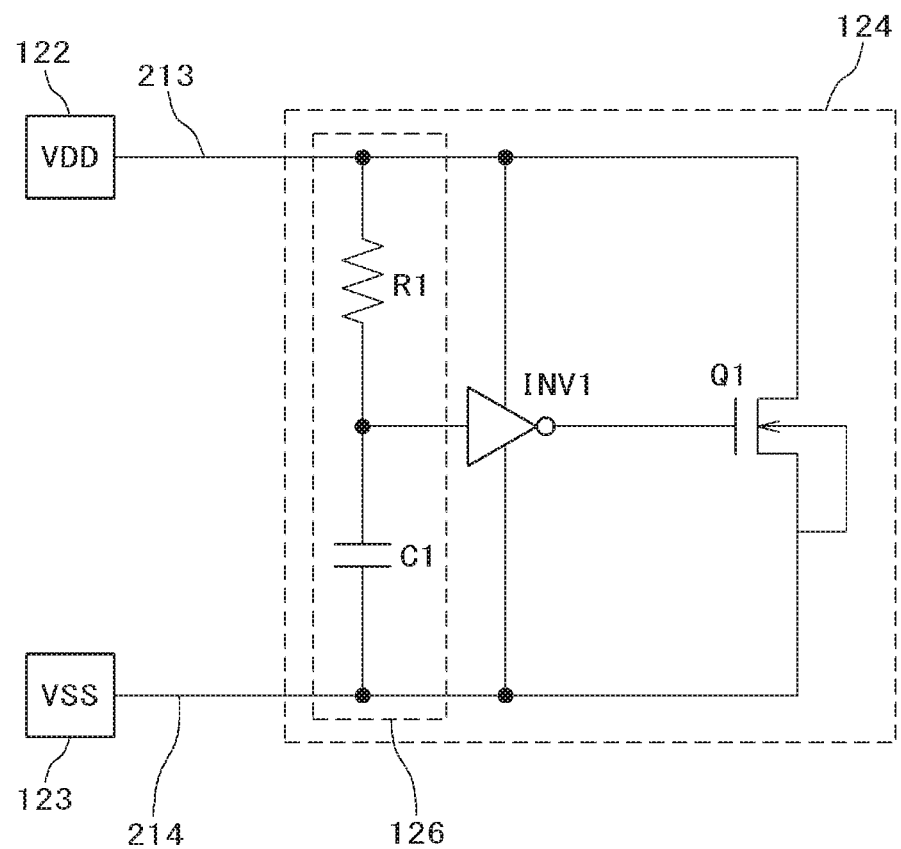
FIG. 11 is a circuit diagram of an ESD protection circuit in FIG. 9.

FIG. 10 is a circuit diagram illustrating the relation of connection between power supply cells and input/output cells and power supply in Example 1 and is matched with the orientation of the IO region placed on the lower (chip end 21) side in FIG. 9. FIG. 11 is a circuit diagram of an ESD protection circuit 124 in FIG. 9. The input/output cells 11 include an input/output circuit 111 connected to an input/output terminal (I/O) 112. The power supply cell 12A includes a wiring 217 connecting to the power supply wiring 211 supplying power from a power supply terminal (VDD) 122 to the interior of the chip and a diode D3 as an ESD protection circuit. The power supply cell 13A includes a wiring 218 connecting to the grounding wire 212 supplying a ground potential from a grounding terminal (VSS) 123 to the interior of the chip. The power supply cell 12A is provided with the diode D3 of the ESD protection circuit 121 in FIG. 4 but is not provided with any other circuit of the ESD protection circuit 121. The power supply cell 13A is not provided with the ESD protection circuit 121. That is, the ESD protection circuit 124 is positioned outside the input/output cells 11 and the power supply cells 12A, 13A. The ESD protection circuit 124 is identical with the circuit encircled with broken line A in the ESD protection circuit 121 in FIG. 4 and is connected to a power supply wiring 213 and a grounding wire 214. The power supply wiring 211, the grounding wire 212, the power supply wiring 213, and the grounding wire 214 are extended along the X direction and the grounding wire 214, the power supply wiring 213, the grounding wire 212, and the power supply wiring 211 are arranged in this order from the chip end 21. The power supply wiring 211 and the power supply wiring 213 are connected with each other and the grounding wire 212 and the grounding wire 214 are connected with each other. The input/output terminals (I/O) 112, the power supply terminal 122, and the grounding terminal 123 are respectively superposed over the input/output cells 11 and the power supply cells 12A, 13A as planarly viewed but may be respectively placed away from the input/output cells 11 and the power supply cells 12A, 13A as planarly viewed. The relation of connection between the power supply cells and input/output cells disposed on the right (chip end 22) side, the upper (chip end 23) side, and the left (chip end 24) side and power supply in FIG. 9 is identical with the relation of connection between the power supply cells and input/output cells disposed on the chip end 21 side and power supply.

Figure 12:
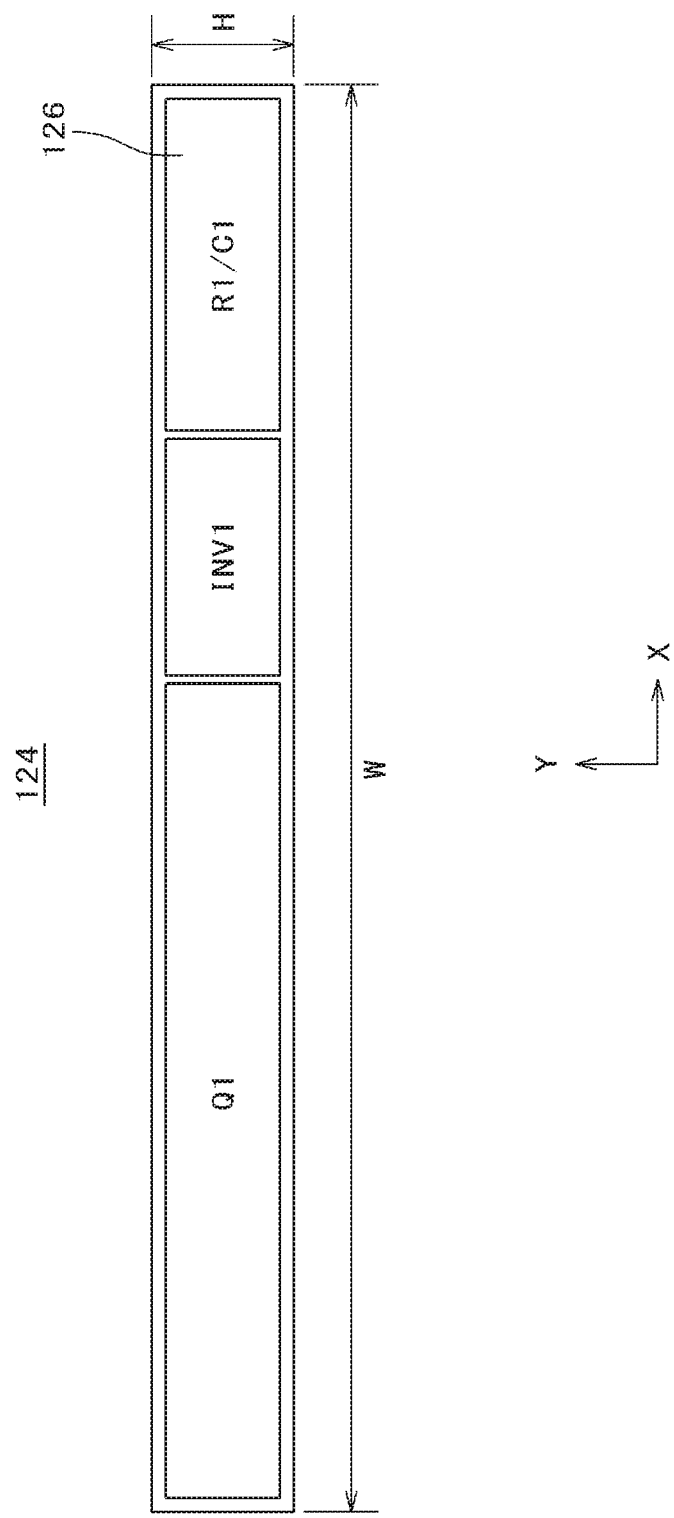
FIG. 12 is a layout diagram of an ESD protection circuit in FIG. 9.
Figure 13:
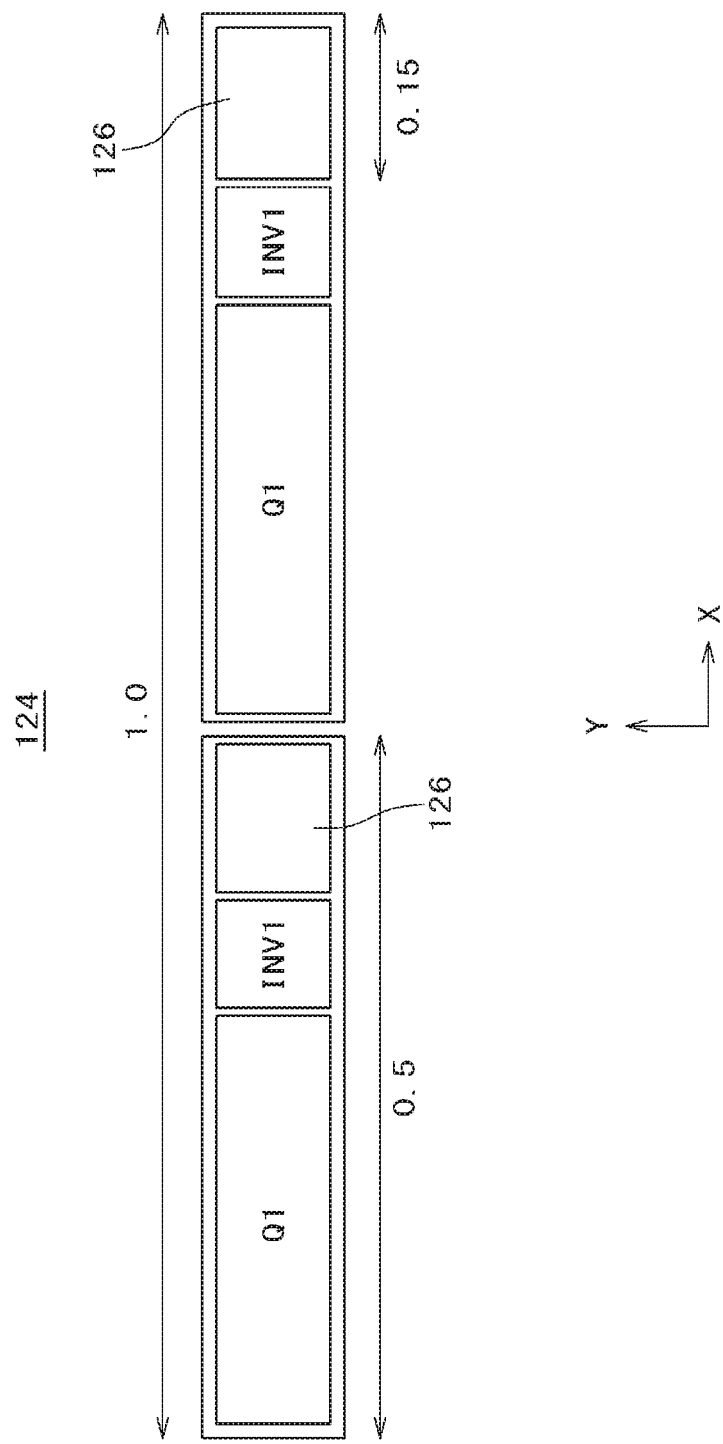
FIG. 13 is a layout diagram of an ESD protection circuit in FIG. 9.

FIG. 12 is a layout diagram of the ESD protection circuit in FIG. 11 and is matched with the orientation of the ESD protection circuit 124 placed on the lower (chip end 21) side in FIG. 9. FIG. 13 is a layout diagram of the ESD protection circuit in FIG. 11 and illustrates a case where two ESD protection circuits are placed. An N-channel transistor Q1, an inverter INV1, and an RC timer 126 are arranged in this order from the chip end 24 side. Instead, the N-channel transistor Q1, the inverter INV1, and the RC timer 126 may be arranged in this order from the chip end 22 side. Unlike the input/output cells 11 and the power supply cells 12A, 13A, the ESD protection circuit 124 is longer in the X direction (cell width (W)) than in the Y direction (cell height (H)). That is, the cell of the ESD protection circuit 124 is in a laterally long shape with a reduced height. One ESD protection circuit 124 is opposed to more than one input/output cell 11. A plurality of the ESD protection circuits 124 are arranged end to end along the X direction. The ESD protection circuits 124 arranged on the right (chip end 22) side, the upper (chip end 23) side, and the left (chip end 24) side in FIG. 9 are arranged similarly to the ESD protection circuits 124 arranged on the chip end 21 side. In FIG. 9, the ESD protection circuits 124 are placed outside the IO regions but may be placed inside the IO regions.

According to this example, an ESD protection circuit 124 is placed in immediate proximity to all the input/output cells and thus specified values in ESD design constraints (the circling wiring resistance of power supply lines and grounding wires in IO regions) can be significantly mitigated. In the power supply cells 12A placed between input/output cells, a diode D3 between a power lead-in metal wiring and a power supply line and a grounding wire is placed and no ESD protection circuit 124 is placed. In the power supply cells 13A, a ground lead-in metal wiring is placed and no ESD protection circuit 121 is placed. As a result, the power supply cells 12A, 13A can be made smaller in area than the input/output cells 11 and the cell width and cell height of the power supply cells 12A, 13A can be matched with the cell width and cell height of the input/output cells 11. This is an effect of ESD protection circuit reduction and cases coped with by placing ESD protection circuits inside IO regions are significantly reduced. The problem of complicated design incidental to the foregoing, such as pressure from a chip internal region, connection of an IO region with a circling wiring, and production of projections and depressions can be solved. The area of the ESD protection circuits placed in the power supply cells in the IO regions in the comparative example can be reduced and the length per chip side can be accordingly shortened. As a result, the problem of an increased chip area due to the input/output pad neck is eliminated and chip areas can be reduced.

<Modification 1>

A description will be given to an example in which the cell layout of the ESD protection circuits in Example 1 is modified (Modification 1).

Figure 14:
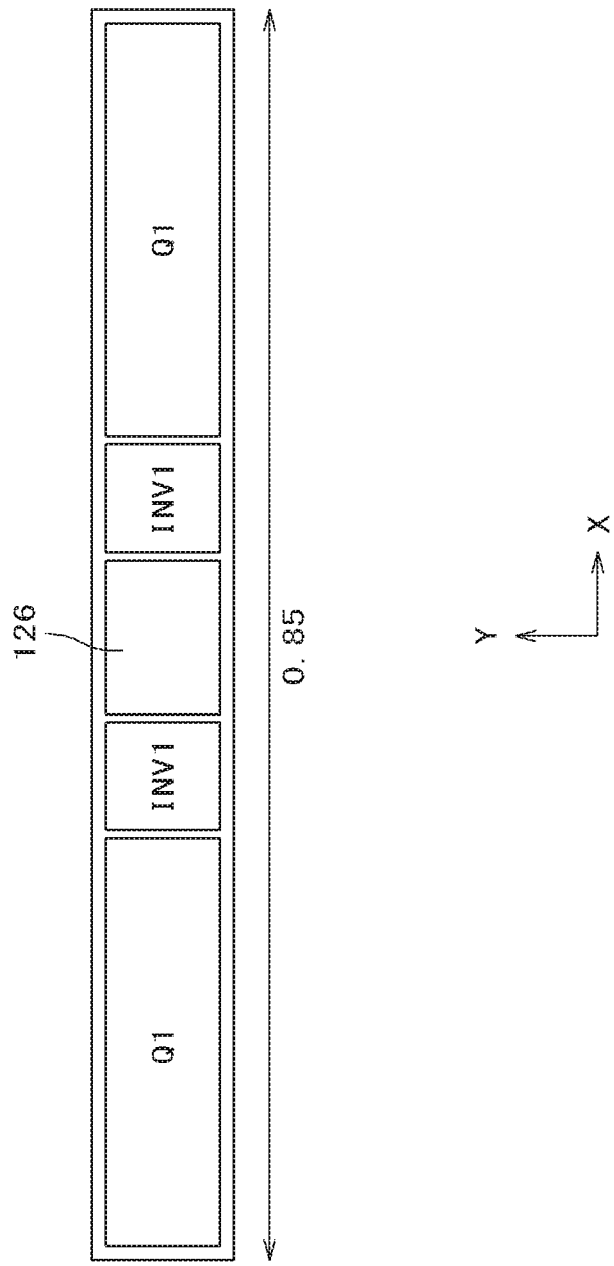
FIG. 14 is a layout diagram of a first ESD protection circuit of a semiconductor device in Modification 1.

FIG. 14 is a layout diagram of an ESD protection circuit in a semiconductor device in Modification 1 and is matched with the orientation of the ESD protection circuit placed on the lower (chip end 21) side in FIG. 9. In the semiconductor device in Modification 1, an RC timer is shared between two ESD protection circuits. An N-channel transistor Q1, an inverter INV1, the RC timer 126, an inverter INV1, and an N-channel transistor Q1 are disposed in this order from the chip end 24 side. A plurality of the first ESD protection circuit 124A is FIG. 14 are arranged end to end along the X direction. The ESD protection circuits 124A placed on the right (chip end 22) side, the upper (chip end 23) side, and the left (chip end 24) side in FIG. 9 are arranged similarly to the ESD protection circuits 124A arranged on the chip end 21 side.

As a result, the total area occupied by the RC timers 126 in the chip in Modification 1 can be reduced by half as compared with Example 1. For example, when it is assumed that the RC timer 126 accounts for 30% of the area of the ESD protection circuit 124 as shown in FIG. 13, in Modification 1, the area of the ESD protection circuits 124A can be reduced by 15% as shown in FIG. 14.

<Modification 2>

A description will be given to an example in which a different function is added to the input/output cells in Example 1 (Modification 2).

Figure 15:
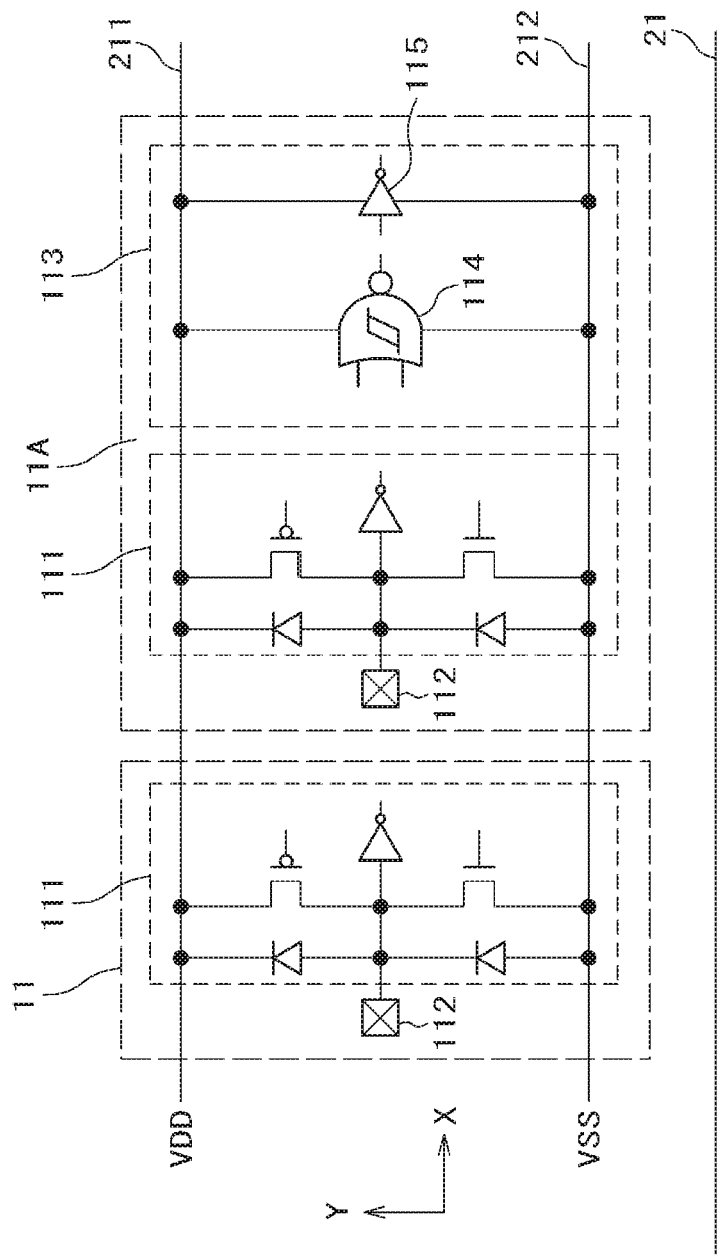
FIG. 15 is a circuit diagram of an IO region of a semiconductor device in Modification 2.
Figure 16:
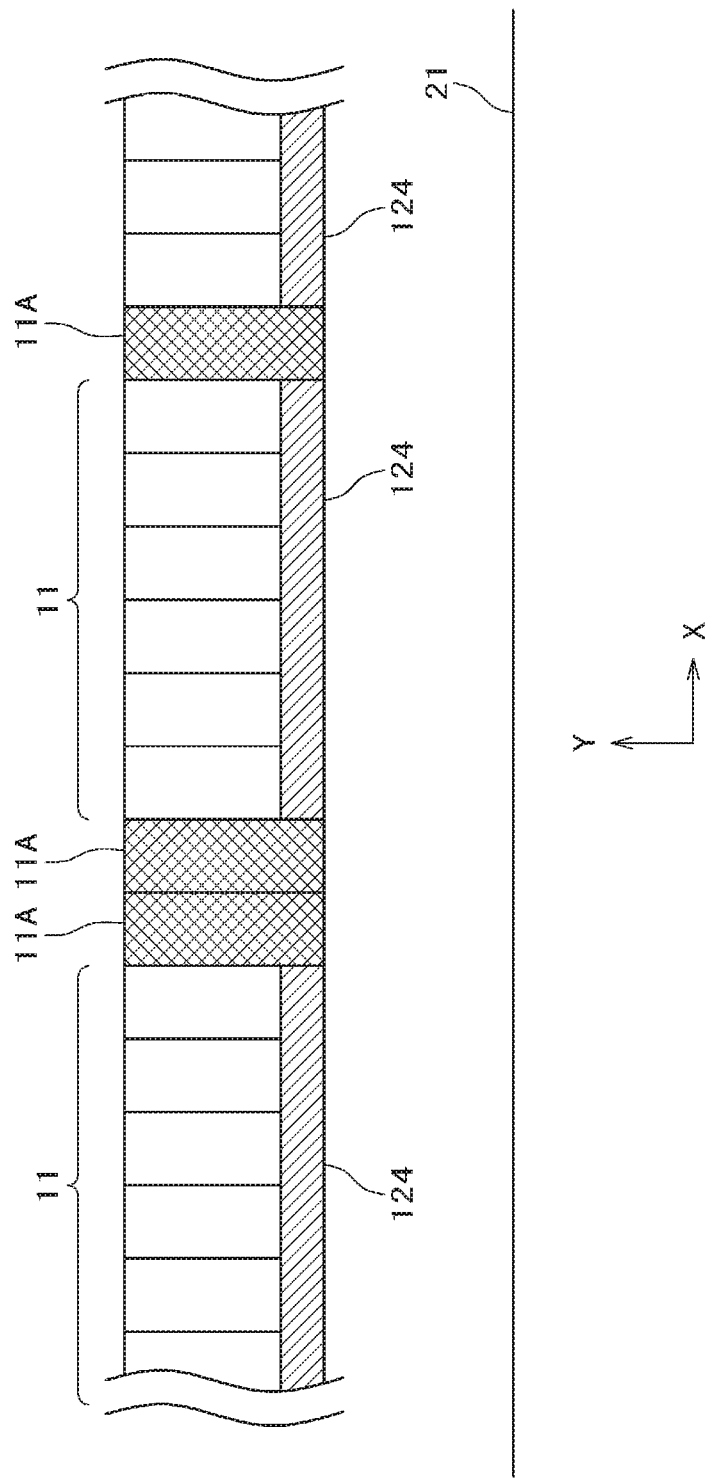
FIG. 16 is a layout diagram of an IO region in FIG. 15.

FIG. 15 is a circuit diagram of an IO region in a semiconductor device in Modification 2 and is matched with the orientation of the IO region placed on the lower (chip end 21) side in FIG. 9. FIG. 16 is a layout diagram of the IO region in FIG. 15. The semiconductor device in Modification 2 is provided with an input/output cell 11A different from ordinary input/output cells 11. In addition to the functions of the input/output cells 11, the input/output cells 11A are each provided with functions provided by logic circuits, such as a Schmitt trigger NOR (NOR) 114 and an inverter 115. The NOR 114 and the inverter 115 are connected to a power supply wiring 211 and a grounding wire 212. As a result, the input/output cells 11A are larger in area than the input/output cells 11. For example, when the cell width of the input/output cells 11A is matched with the cell width of the input/output cells 11, the cell height of the input/output cells 11A is larger than the cell height of the input/output cells 11. However, an increased portion of the height of the input/output cells 11A can be absorbed by avoiding the placement of an ESD protection circuit 124 in a place where an input/output cell 11A is placed. When cell width is equalized or width reduction is carried out in input/output cells different in specification and thus different in area, some cells are protruded inward of the chip. These protruded portions are placed such that the protruded portions are absorbed by the placement region of the ESD protection circuits 124. The input cells 11A placed on the right (chip end 22) side, the upper (chip end 23) side, and the left (chip end 24) side in FIG. 9 are placed similarly to the input cells 11A placed on the chip end 21 side.

As a result, the width of the input/output cells is standardized (or reduced) and area reduction can be carried out by pitch equalization (pitch reduction). Design complication, such as pressure from a chip internal region and production of projections and depressions caused by planarization of input/output cells.

<Modification 3>

A description will be given to an example in which the pad positions in Example 1 are changed (Modification 3).

Figure 17:
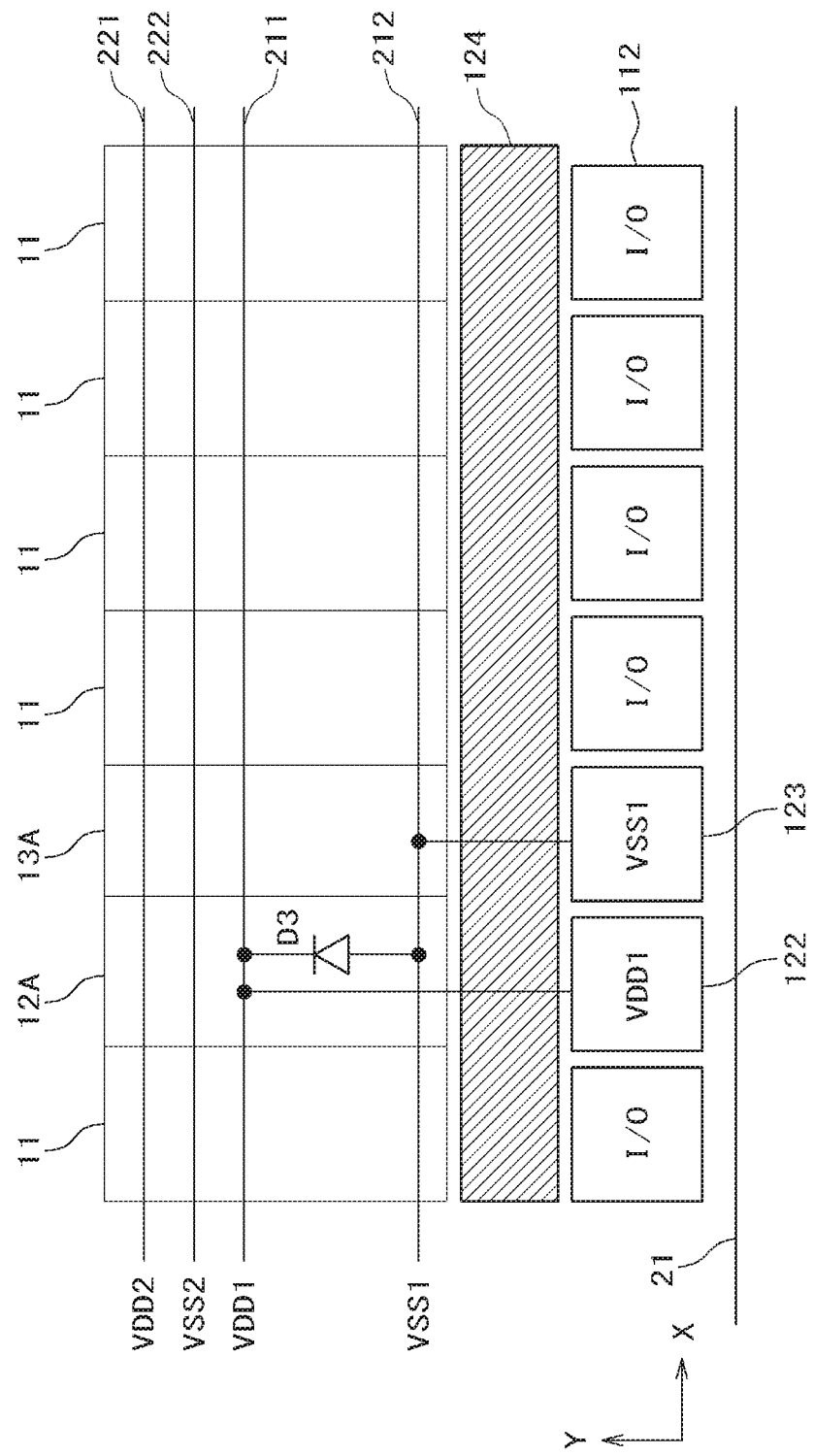
FIG. 17 is a layout diagram of an IO region of a semiconductor device in Modification 3.

FIG. 17 is a layout diagram of an IO region in a semiconductor device in Modification 3 and is matched with the orientation of the IO region placed on the lower (chip end 21) side in FIG. 9. The semiconductor device in Modification 3 is an example in which input/output terminals 112, a power supply terminal 122, and a grounding terminal 123 are placed between an ESD protection circuit 124 and a chip end 21. The width of the input/output terminals 112, the power supply terminal 122, and the grounding terminal 123 is substantially equal to or smaller than the width of the input/output cells 11. The input/output cells 11, power supply cells 12A, 13A and ESD protection circuits 124 of the semiconductor device in Modification 3 are identical with those in Example 1. The input/output terminals 112, the power supply terminals 122, and the grounding terminal 123 placed on the right (chip end 22) side, the upper (chip end 23) side, and the left (chip end 24) side in FIG. 9 are placed similarly to the input/output terminals 112, the power supply terminal 122, and the grounding terminal 123 placed on the chip end 21 side.

In the semiconductor device in Modification 3, the supply voltage (VDD1) of a power supply wiring 211 connected to the power supply terminal 122 and the grounding voltage (VSS1) of a grounding wire 212 connected to the grounding terminal 123 are used in input/output circuits 111; and the supply voltage (VDD2) of a power supply wiring 221 and the grounding voltage (VSS2) of a grounding wire 222 are used in an internal circuit. Aside from the wirings for supply voltage (VDD1) and grounding voltage (VSS1), wirings for supply voltage (VDD2) and grounding voltage (VSS2) are placed in each IO region. The supply voltage (VDD2) and the grounding voltage (VSS2) may be generated from the supply voltage (VDD1) and the grounding voltage (VSS1) by a step-down circuit or may be externally supplied via a power supply terminal and a grounding terminal.

<Modification 4>

A description will be given to an example in which the pads in Example 1 are placed in a staggered arrangement (Modification 4).

Figure 18:
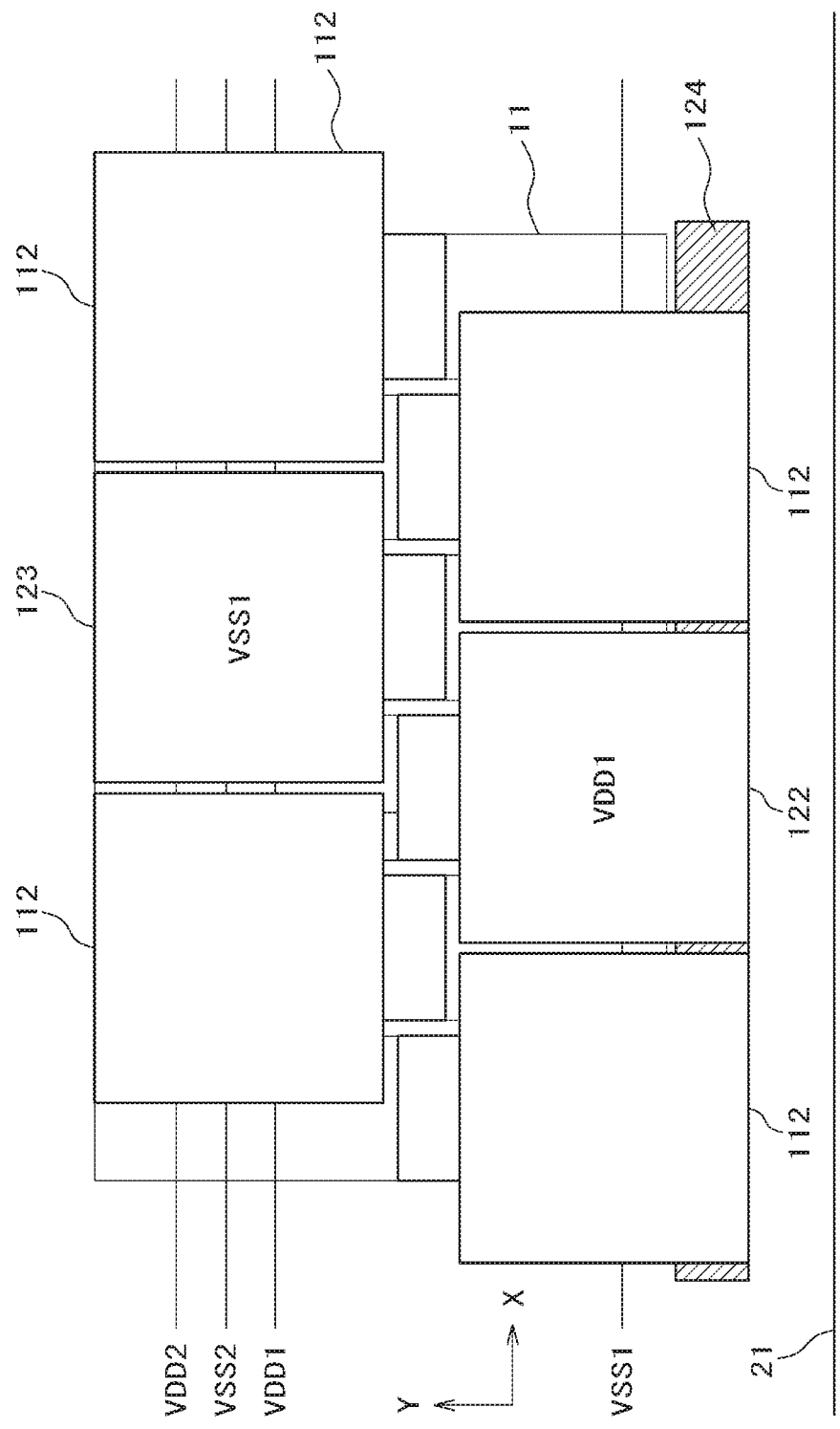
FIG. 18 is a layout diagram of an IO region of a semiconductor device in Modification 4.
Figure 19:
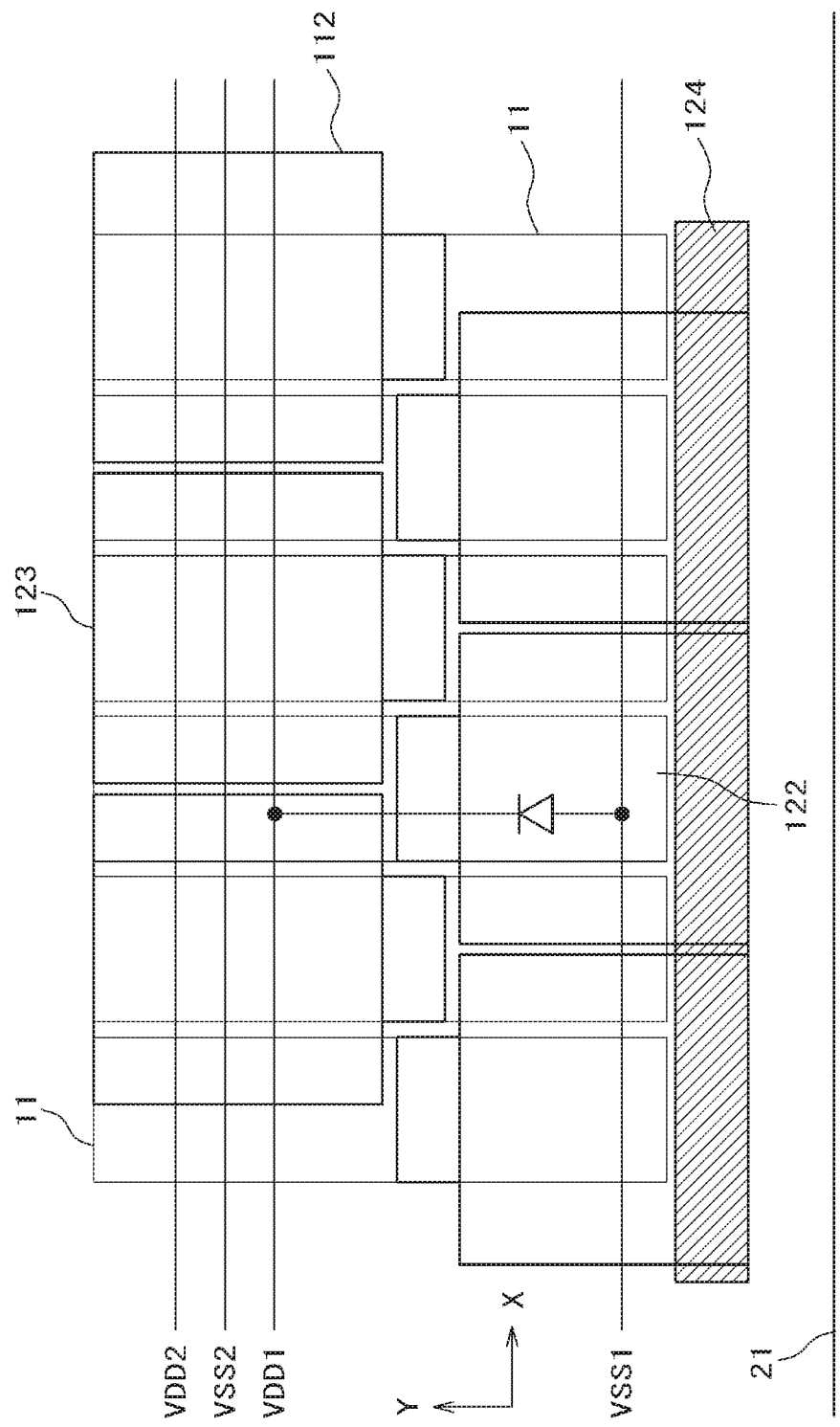
Figure 20:
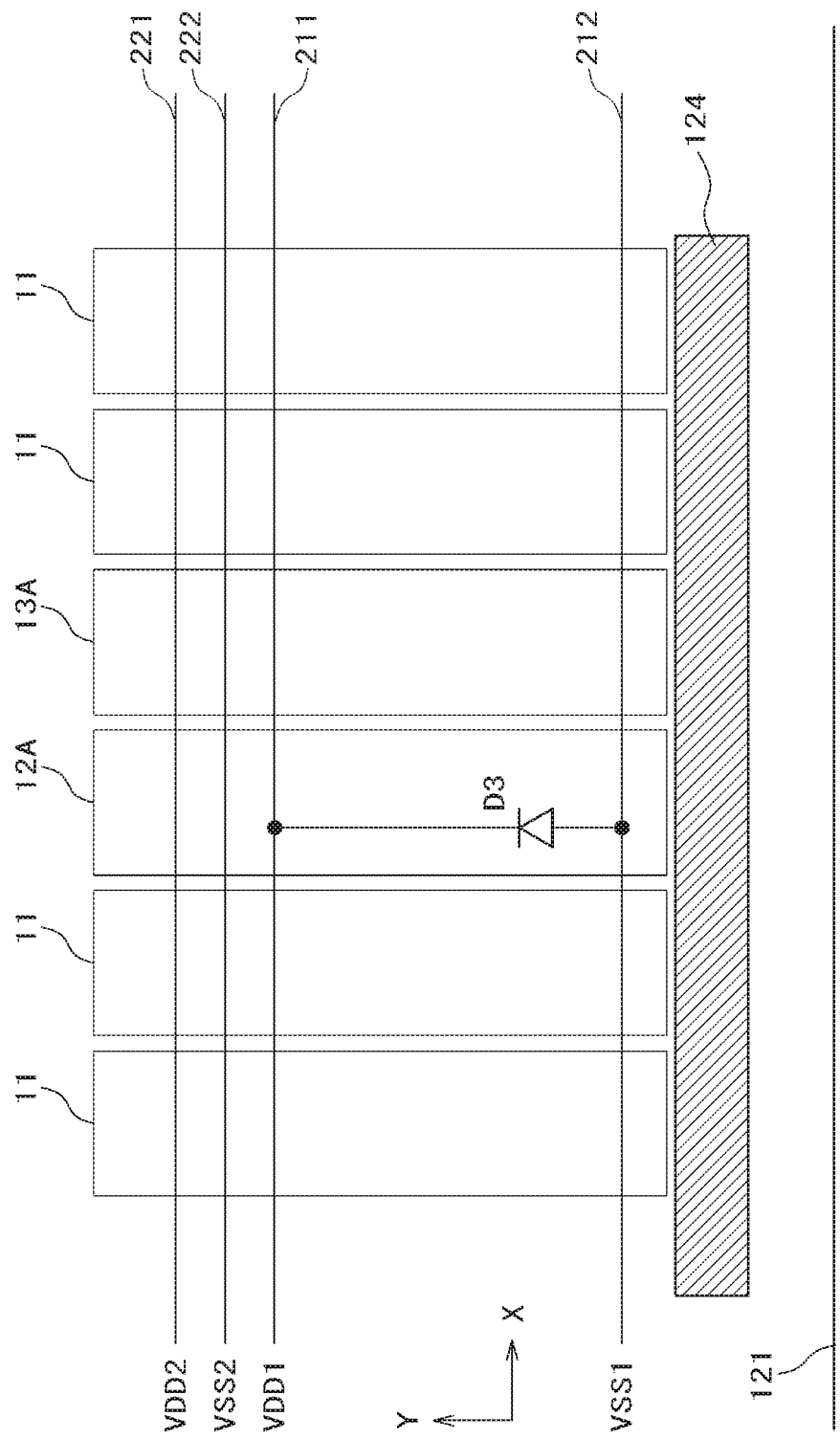
FIG. 20 is a layout diagram of FIG. 18 with the pads removed.

FIG. 18 is a layout diagram of an IO region in a semiconductor device in Modification 4 and is matched with the orientation of the IO region placed on the lower (chip end 21) side in FIG. 9. FIG. 19 is a layout diagram equivalent to FIG. 18 with the pads seen through. FIG. 20 is a layout diagram equivalent to FIG. 18 with the pads removed. The semiconductor device in Modification 4 is formed by making the input/output cells 11 smaller in width (larger in cell height) than in Modification 3 and disposing the input/output terminals 112, the power supply terminals 122, and the grounding terminal 123 in a staggered arrangement (zigzag arrangement) in the IO regions. In Modification 4, the width of the input terminal 112, the power supply terminal 122, and the grounding terminal 123 is larger than the width of the input/output cells 11 and the power supply cells 12A, 13A. Therefore, one input/output terminal 112 or power supply terminal 122 or power supply terminal 123 is superposed over any adjoining three of an input/output cell 11 and a power supply cell 12A and a power supply cell 13A as planarly viewed. One power supply terminal 122 is superposed over adjoining input/output cell 11 and power supply cell 13A as planarly viewed. In the semiconductor device in Modification 4, the input/output cells 11, the power supply cells 12A, 13A, and the ESD protection circuits 124 are identical with those in Example 1 and Modification 3 except cell shape. The input/output terminals 112, the power supply terminals 122, and the grounding terminals 123 placed on the right (chip end 22) side, the upper (chip end 23) side, and the left (chip end 24) side in FIG. 9 are placed similarly to the input/output terminals 112, the power supply terminal 122, and the grounding terminal 123 placed on the chip end 21 side.

The input/output pad neck can be improved by the staggered arrangement and thus chip areas can be reduced.

<Modification 5>

A description will be given to an example in which the arrangement of the power supply wirings/grounding wires in Example 1 is changed (Modification 5).

Figure 21:
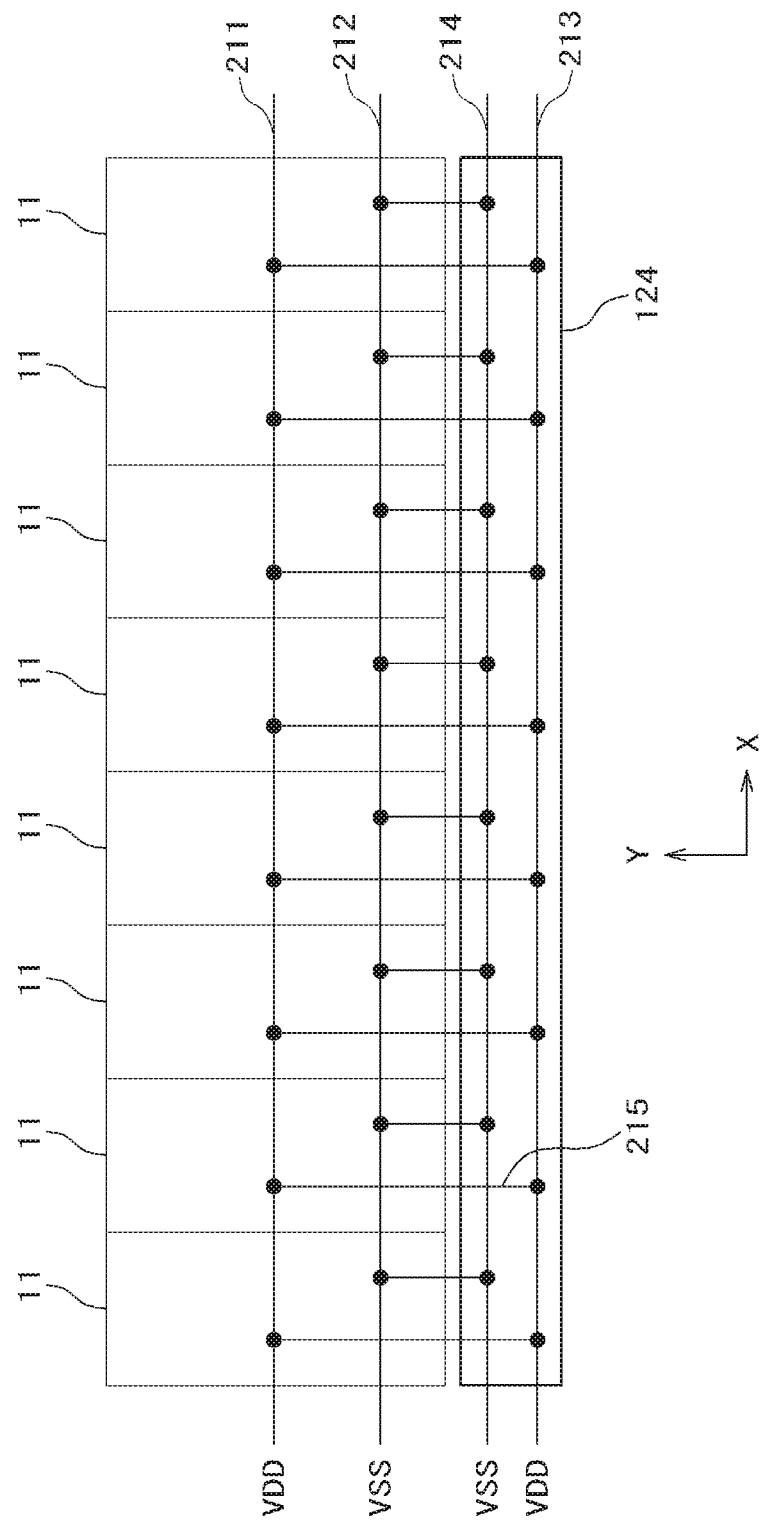
FIG. 21 is a connection diagram of power supply lines and grounding wires in an IO region of a semiconductor device in Modification 5.
Figure 22:
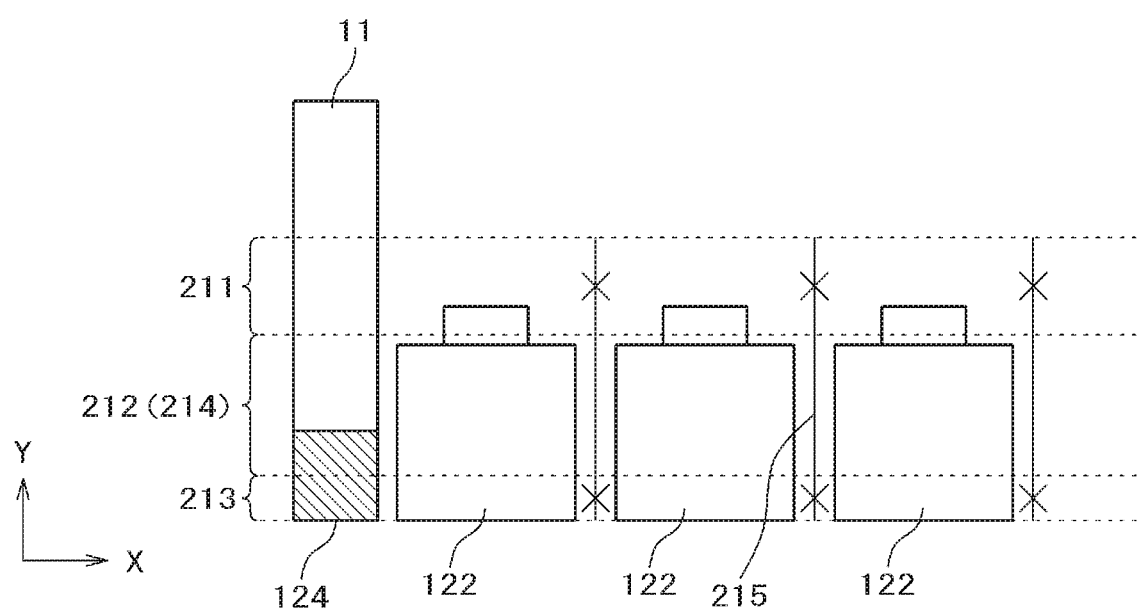
FIG. 22 is a layout diagram of the IO region in FIG. 21.

FIG. 21 is a connection diagram of the power supply wirings and grounding wires in an IO region in a semiconductor device in Modification 5 and is matched with the orientation of the IO region placed on the lower (chip end 21) side in FIG. 9. FIG. 22 is a layout diagram of the IO region in FIG. 21. In Modification 5, the arrangements of the power supply wiring 213 and the grounding wire 214 of the ESD protection circuit 124 in Example 1 are changed and the arrangements of the N-channel transistor, the P-channel transistor, and the like are accordingly changed. In other respects, Modification 5 is identical with Example 1. The grounding wires 212, 214 are placed and connected inside the input/output cells 11 and the ESD protection circuit 124 on the side where the input/output cells 11 and the ESD protection circuit 124 adjoin to each other. In the exemplary layout in FIG. 22, the input/output cells 11 and the ESD protection circuit 124 overlap with pads 122 as planarly viewed but in FIG. 22, only either of them overlapping with each other is depicted to make the figure easier to view. The arrangements of an input/output cell 11 and an ESD protection circuit 124 are shown on the left of the figure and the arrangement of the pads 122 is shown on the right. The regions where the power supply wiring 211 connecting to an input/output cell 11 is placed, the regions for the grounding wire 212 connecting to an input/output cell 11 and the grounding wire 214 connecting to the ESD protection circuit 124, and the regions where the power supply wiring 213 connecting to the ESD protection circuit 124 is placed are each extended along the X direction. The power supply wiring 211 for the input/output cells 11 and the power supply wiring 213 for the ESD protection circuit 124 are connected with each other via a wiring 215. The wirings 215 are made of low-resistance metal in an upper layer than the metal of the power supply wirings 211, 213 and are placed in spaces between pads 122. The power supply wirings and the grounding wires placed on the right (chip end 22) side, the upper (chip end 23) side, and the left (chip end 24) side in FIG. 9 are placed similarly to the power supply wirings and the grounding wires placed on the chip end 21 side.

This provides a wiring structure making it easier to cope with design constraints, such as resistance value and current density. Since grounding wires are made easier to connect and can be connected using metal in the same layer, a greater effect is obtained in products with a smaller total number of wirings.

<Modification 6>

A description will be given to an example in which a plurality of power supply domains are provided (Modification 6).

Figure 23:
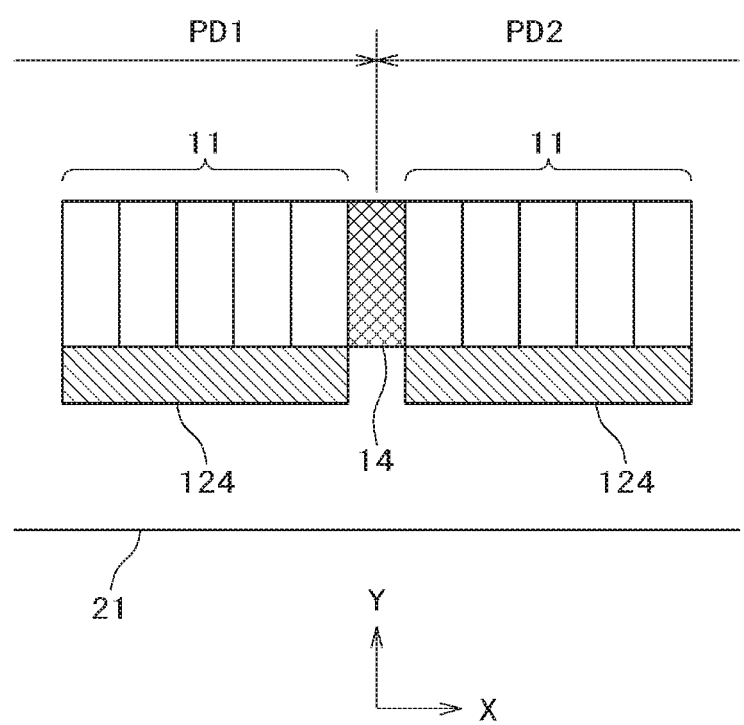
FIG. 23 is a layout diagram of an IO region of a semiconductor device in Modification 6.
Figure 24:
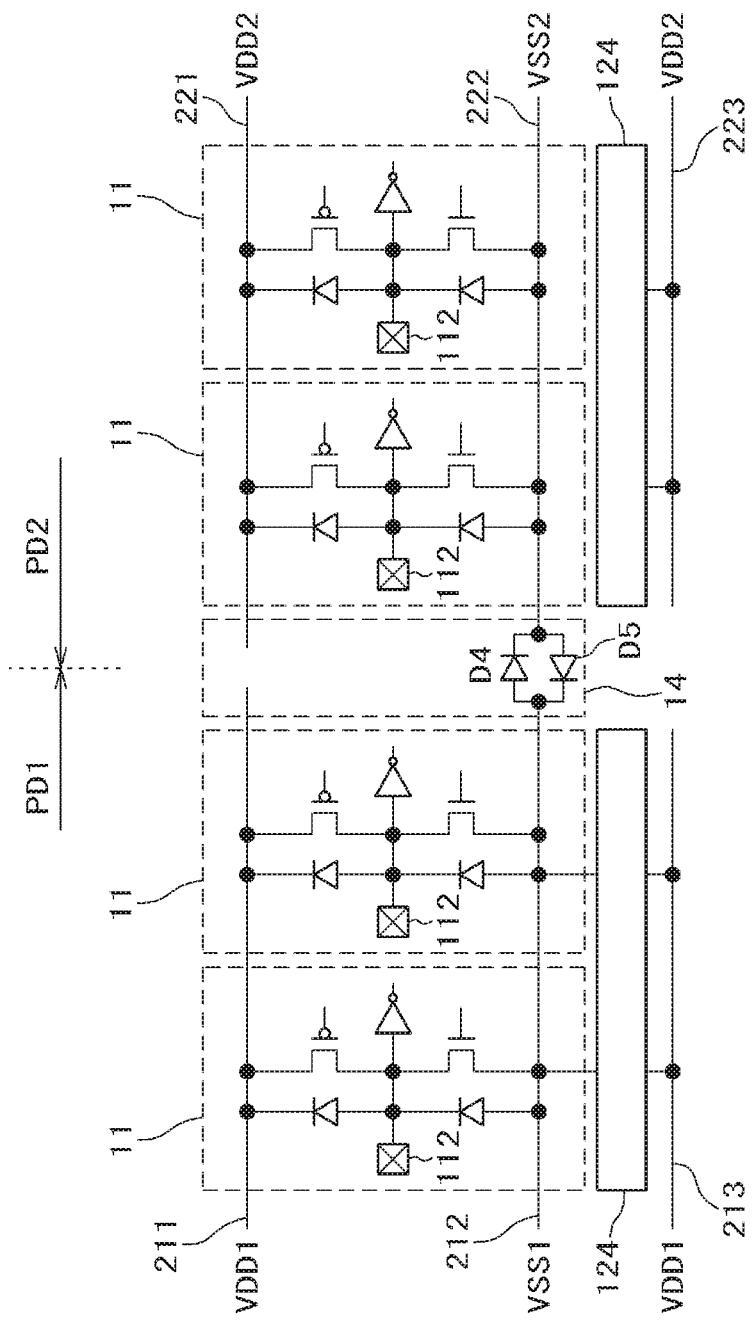
FIG. 24 is a circuit diagram of the IO region in FIG. 23.

FIG. 23 is a layout diagram of an IO region in a semiconductor device in Modification 6 and is matched with the orientation of the IO region placed on the lower (chip end 21) side in FIG. 9. FIG. 24 is a circuit diagram of the IO region in FIG. 23. When a power supply used in an IO region and a power supply used in an internal circuit are made different from each other as in Modification 3, it turns out that the semiconductor device is provided therein with a plurality of power supply regions (power supply domains). The semiconductor device in Modification 6 is provided with a power supply domain PD1 operating on power supply (VDD1) and ground (VSS1) and a power supply domain PD2 operating on power supply (VDD2) and ground (VSS2) and is also provided in the IO regions with the power supply domain PD1 and the power supply domain PD2. Each of the power supply domain PD1 and the power supply domain PD2 is provided with input/output cells 11, power supply cells 12A, 13A, and ESD protection circuits 124 as in Example 1. The semiconductor device in Modification 6 is provided between a power supply domain PD1 and a power supply domain PD2 of an IO region with a bridge cell (bridge circuit) 14. Each bridge cell 14 is provided with bidirectional diodes D4, D5 connecting a grounding wire 212 of a power supply domain PD1 and a grounding wire 222 of a power supply domain PD2 with each other. The anode of the diode D4 is connected to the grounding wire 212 and the cathode thereof is connected to the grounding wire 222. The anode of the diode D5 is connected to the grounding wire 222 and the cathode thereof is connected to the grounding wire 212. A power supply wiring 211 and a power supply wiring 221 are isolated from each other.

Figure 25:
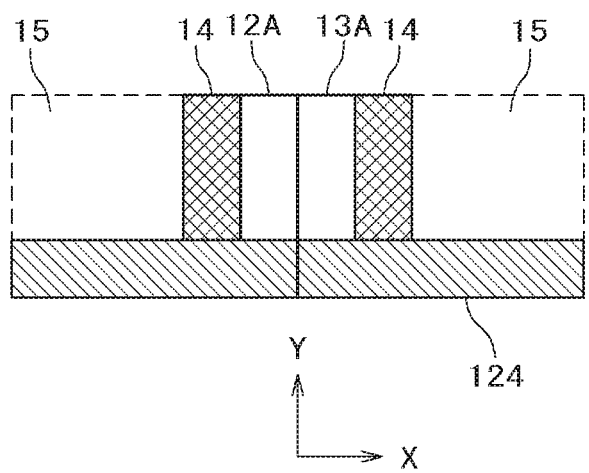
FIG. 25 is a layout diagram explaining a problem related to the IO region in FIG. 23.
Figure 26:
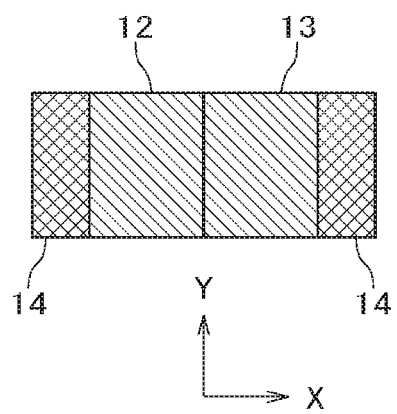
FIG. 26 is a layout diagram explaining a means for solving the problem related to the IO region in FIG. 23.

FIG. 25 is a layout diagram explaining a problem involved in the IO region in FIG. 23. FIG. 26 is a layout diagram explaining a means for solving the problem involved in the IO region in FIG. 23. For example, in case of such small-scale power supply domains that a second power supply domain of an IO region is made up only of power supply cells 12A, 13A in an internal circuit, the width of the ESD protection circuits 124 is larger than the width of the power supply cells 12A, 13A and the bridge cells 14 and a dead space 15 is produced. In such a case, it may be preferable to use power supply cells 12, 13 including an ESD protection circuit 124 as in the comparative example in FIG. 26.

Example 2

A description will be given to an example in which Example 1 and a comparative example are combined with each other (Example 2).

Figure 27:
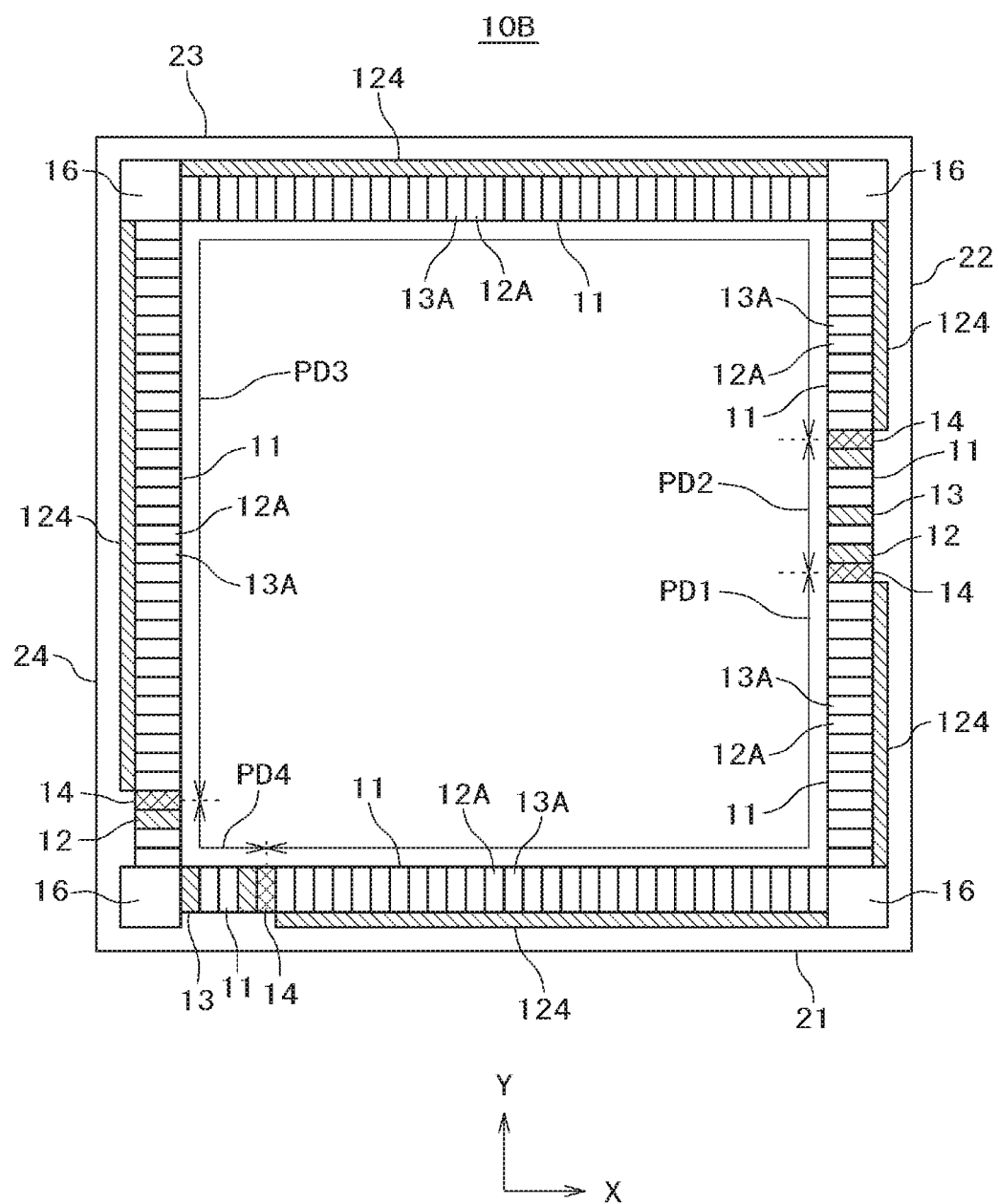
FIG. 27 is a schematic layout diagram of a semiconductor device in Example 2.
Figure 28:
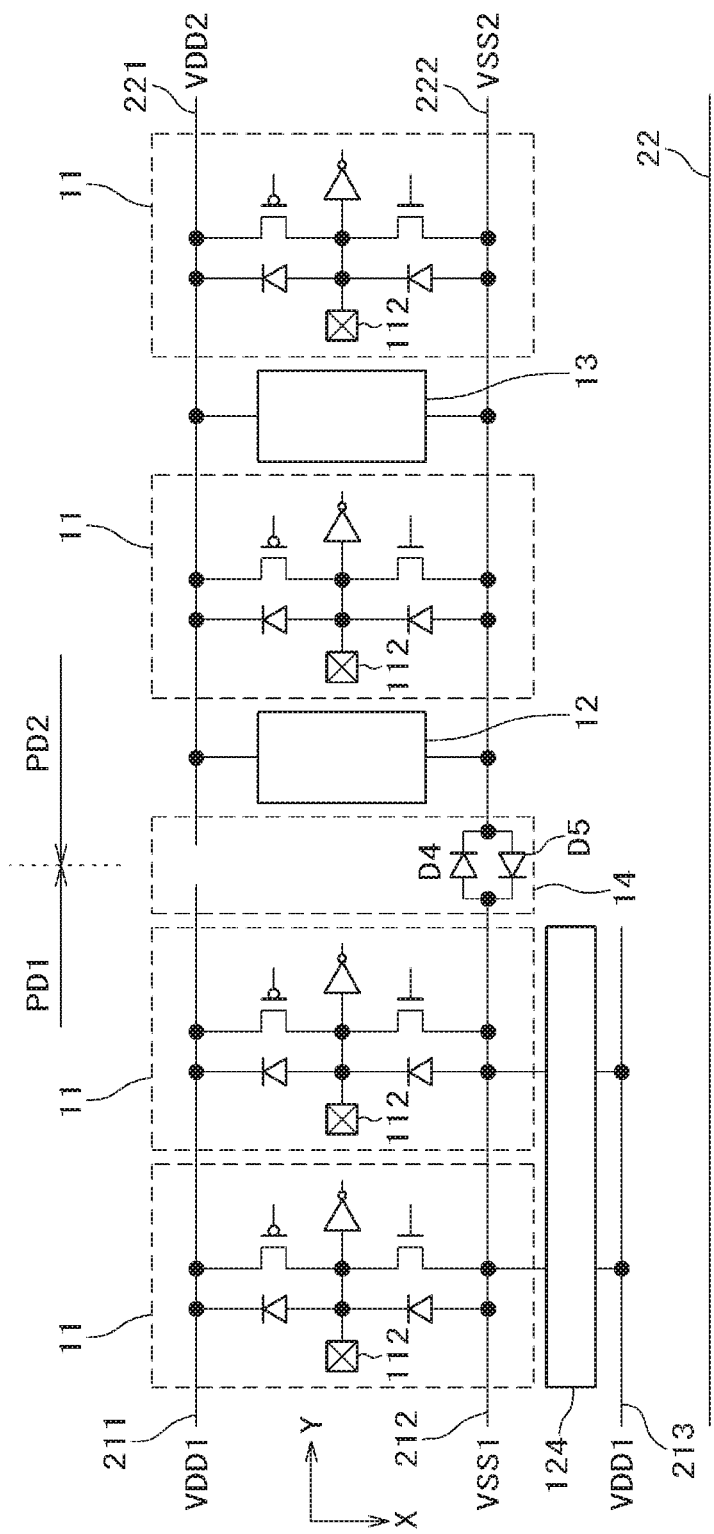
FIG. 28 is a circuit diagram of an IO region in FIG. 27.

FIG. 27 is a schematic layout diagram of a semiconductor device in Example 2. FIG. 28 is a circuit diagram of an IO region in FIG. 27 and is matched with the orientation of the IO region placed on the lower (chip end 21) side in FIG. 27. The semiconductor device 10B has four different types of power supply domains: two types of power supply domains, positioned at the upper left and the lower right in the figure, to which the technology related to Example 1 is applied; and two types of power supply domains, positioned at the lower left and on the right side, to which the technology related to the comparative example is applied. That is, the semiconductor device 10B is provided on a single semiconductor substrate with four power supply domains PD1, PD2, PD3, PD4. For the IO regions of the power supply domains PD1, PD3, the same IO regions (input/output cells 11, input/output terminals 112, power supply cells 12A, 13A, power supply terminals 122, grounding terminal 123, and ESD protection circuits 124) as in Example 1 are provided on the periphery of the chip. For the IO regions of the power supply domains PD2, PD4, the same IO regions (input/output cells 11, input/output terminals 112, power supply cells 12, 13, power supply terminals 122, and grounding terminals 123) as in the comparative example are provided on the periphery of the chip. A bridge cell (bridge circuit) 14 is provided in each boundary between the IO regions of the power supply domains PD1, PD2, PD3, PD4. The area of the IO regions of the power supply domains PD2, PD4 is smaller than the area of the IO regions of the power supply domains PD1, PD3. In other words, the length in the direction in which the IO regions of the power supply domains PD2, PD4 are extended along chip ends is smaller than the length in the direction in which the IO regions of the power supply domains PD1, PD3 are extended along chip ends.

The input/output cells 11 of the power supply domain PD1 are connected to a power supply wiring 211 and a grounding wire 212; the power supply cells 12A are connected to the power supply wiring 211 and the grounding wire 212; and the power supply cells 13A are connected to the grounding wire 212. The ESD protection circuits 124 are connected to a power supply wiring 213 and the grounding wire 212. The power supply wiring 211, the grounding wire 212, and the power supply wiring 213 are extended along the Y direction (the direction in which a side constituted by the chip end 22 is extended) and the power supply wiring 213, the grounding wire 212, and the power supply wiring 211 are placed in this order from the chip end 22. The power supply domain PD1 also includes a portion in which the input/output cells 11 and the power supply cells 12A, 13A are serially arranged in the X direction and in this portion, the power supply wiring 211, the grounding wire 212, and the power supply wiring 213 are extended along the X direction (the direction in which a side constituted by the chip end 21 is extended).

The input/output cells 11 of the power supply domain PD2 are connected to a power supply wiring 221 and a grounding wire 222; the power supply cell 12 is connected to the power supply wiring 221 and the grounding wire 222; and the power supply cell 13 is connected to the power supply wiring 221 and the grounding wire 222. The power supply wiring 221 and the grounding wire 222 are extended along the Y direction and the grounding wire 222 and the power supply wiring 221 are placed in this order from the chip end 22.

A bridge cell 14 is provided between the power supply domain PD1 and the power supply domain PD2. The bridge cell 14 is provided with bidirectional diodes D4, D5 connecting the grounding wire 212 of the power supply domain PD1 and the grounding wire 222 of the power supply domain PD2 with each other. The anode of the diode D4 is connected to the grounding wire 212 and the cathode thereof is connected to the grounding wire 222. The anode of the diode D5 is connected to the grounding wire 222 and the cathode thereof is connected to the grounding wire 212. The power supply wiring 211 and the power supply wiring 221 are isolated from each other.

The input/output terminals (I/O) 112, power supply terminals 122, grounding terminals 123 of the power supply domain PD1 are respectively superposed over the input/output cells 11 and the power supply cells 12A, 13A as planarly viewed but may be respectively placed away from the input/output cells 11 and the power supply cells 12A, 13A as planarly viewed. The input/output terminals (I/O) 112, power supply terminal 122, and grounding terminal 123 of the power supply domain PD2 are respectively superposed over the input/output cells 11 and the power supply cells 12, 13 as planarly viewed but may be respectively placed away from the input/output cells 11 and the power supply cells 12, 13 as planarly viewed.

The IO region of the power supply domain PD3 is configured similarly to the IO region of the power supply domain PD1. The IO region of the power supply domain PD4 is configured similarly to the IO region of the power supply domain PD2. However, the IO region of the power supply domain PD4 is placed at a corner of the chip and includes a portion opposed to the chip end 21 and a portion opposed to the chip end 24.

The semiconductor device 10B is provided at the four corners of the chip thereof with a corner cell 16. A corner cell 16 within an identical power supply domain is provided with a power supply wiring and a grounding wire for that power supply domain. Like the semiconductor device 10A, the semiconductor device 10B has an internal circuit inside the IO regions.

Increase in chip area can be suppressed by placing an ESD protection circuit according to the comparative example in a small-scale power supply domain and placing an ESD protection circuit according to Example 1 in a large-scale power supply domain. Influence of noise from an analog circuit and the like can be suppressed by partly placing an ESD protection circuit according to the comparative example in series with an input/output circuit according to the scale of the power supply domain, for example, by using an ESD protection circuit according to the comparative example in a power supply domain for the analog circuit.

Example 1 and Modifications 1 to 6 may be combined as appropriate. Modifications 1 to 5 to Example 1 may be adopted as modifications to Example 2. Example 2 and Modifications 1 to 5 may be combined as appropriate.

Up to this point, a concrete description has been given to the invention made by the present inventors based on the embodiment, examples, and modifications. The present invention is not limited to the above embodiment, examples, or modifications and may be variously modified, needless to add.

REFERENCE SIGNS LIST 10, 10A, 10B, 10S: semiconductor device
11: input/output cell
111: input/output circuit
D1, D2: diode
Q2: P-channel transistor
Q3: N-channel transistor
INV3: inverter
112: input/output terminal (input/output pad)
12, 13: power supply cell
121: ESD protection circuit
122: power supply terminal (power supply pad)
123: grounding terminal (ground pad)
12A: power supply cell
124: ESD protection circuit
126: RC timer
R1: resistor
C1: capacitor
INV1: inverter
Q1: N-channel transistor
13A: power supply cell
D3: diode
14: bridge cell (bridge circuit)
16: corner cell
21, 22, 23, 24: chip end
D4, D5: diode

The invention claimed is:

1. A semiconductor device comprising:
a first input/output circuit connected to a first pad;
a second input/output circuit placed in a direction along one side constituted by a chip end with respect to the first input/output circuit and connected to a second pad; and
a first ESD (Electro-Static-Discharge) protection circuit placed in proximity to the chip end outside the first and second input/output circuits,
wherein the first ESD protection circuit includes a first resistor, a first capacitor, a first inverter, and a first N-channel transistor.

2. The semiconductor device according to claim 1, comprising:
a first power supply wiring connected to a first power supply pad; and
a first grounding wire connected to a first ground pad.

3. The semiconductor device according to claim 2,
wherein the first and second input/output circuits respectively include a first diode having an anode connected to a signal wiring and a cathode connected to a first power supply wiring, a second diode having an anode connected to a first grounding wire and a cathode connected to the signal wiring, and an output circuit or an input circuit connected to the signal wiring.

4. The semiconductor device according to claim 3,
wherein one end of the first resistor is connected to the first power supply wiring,
wherein the other end of the first resistor is connected to one end of the first capacitor,
wherein the other end of the first capacitor is connected to the first grounding wire,
wherein the other end of the first resistor is connected to an input of a first inverter,
wherein an output of the first inverter is connected to the gate electrode of a first N-channel transistor, and
wherein the first N-channel transistor forms a current path between the first power supply wiring and the first grounding wire.

5. The semiconductor device according to claim 4, comprising:
a third diode placed between the first input/output circuit and the second input/output circuit and having an anode connected to the first grounding wire and a cathode connected to the first power supply wiring.

6. The semiconductor device according to claim 2, comprising:
a second ESD protection circuit placed in a direction along the side with respect to the first ESD protection circuit,
wherein the second ESD protection circuit includes a second resistor having one end connected to the first power supply wiring, a second capacitor having one end connected to the other end of the second resistor and the other end connected to the first grounding wire, a second inverter receiving input from the other end of the second resistor, and a second N-channel transistor having the gate electrode connected to an output of the second inverter and forming a current path between the first power supply wiring and the first grounding wire.

7. The semiconductor device according to claim 2, comprising:
a third ESD protection circuit placed in the direction along the one side with respect to the first protection circuit,
wherein the third ESD protection circuit includes a third inverter receiving input from the other end of the first resistor and a third N-channel transistor having the gate electrode connected to an output of the third inverter and forming a current path between the first power supply wiring and the first grounding wire.

8. The semiconductor device according to claim 2,
wherein the first pad is superposed over a region where the first input/output circuit is formed as planarly viewed, and wherein the second pad is superposed over a region where the second input/output circuit is formed as planarly viewed.

9. The semiconductor device according to claim 8, wherein the first pad is superposed over a region where the first input/output circuit is formed and a region where the second input/output circuit is formed as planarly viewed, and
wherein the second pad is superposed over a region where the second input/output circuit is formed and a region where the first input/output circuit is formed as planarly viewed.

10. The semiconductor device according to claim 2, wherein the first pad is placed between a region where the first ESD protection circuit is formed and the one side as planarly viewed, and
wherein the second pad is placed between a region where the first ESD protection circuit is formed and the one side as planarly viewed.

11. The semiconductor device according to claim 5, wherein the first power supply wiring includes a third and a fourth power supply wirings extended in a direction along the one side,
wherein the first grounding wire includes a third and a fourth grounding wires extended in a direction along the one side,
wherein the third power supply wiring is connected to the cathode of the first diode and the cathode of the third diode,
wherein the third grounding wire is connected to the anode of the second diode and the anode of the third diode,
wherein the fourth power supply wiring is connected to one end of the first resistor and the first N-channel transistor, and
wherein the fourth grounding wire is connected to the other end of the first capacitor and the first N-channel transistor.

12. The semiconductor device according to claim 11, wherein the fourth grounding wire, the fourth power supply wiring, the third grounding wire, and the third power supply wiring are placed in this order from the chip end side.

13. The semiconductor device according to claim 11, wherein the fourth power supply wiring, the fourth grounding wire, the third grounding wire, and the third power supply wiring are placed in this order from the chip end side.

14. The semiconductor device according to claim 2, comprising:
a second power supply wiring connected to a second power supply pad;
a second grounding wire connected to a second ground pad; and
a third ESD protection circuit placed in a direction along a chip edge side with respect to the first input/output circuit,
wherein the third ESD protection circuit includes a third resistor having one end connected to the second power supply wiring, a third capacitor having one end connected to the other end of the third resistor and the other end connected to the second grounding wire, a third inverter receiving input from the other end of the third resistor, a second N-channel transistor having the gate electrode connected to an output of the third inverter and forming a current path between the second power supply wiring and the second grounding wire, and a fourth diode having an anode connected to the second grounding wire and a cathode connected to the second power supply wiring.

15. The semiconductor device according to claim 14, comprising:
a bridge circuit connecting the first grounding wire and the second grounding wire with each other,
wherein the bridge circuit includes a fifth diode having an anode connected to the first grounding wire and a cathode connected to the second grounding wire and a sixth diode having an anode connected to the second grounding wire and a cathode connected to the first grounding wire.

16. A semiconductor device comprising:
a first power supply domain connected to a first power supply pad and a first ground pad; and
a second power supply domain connected to a second power supply pad and a second ground pad,
wherein the first power supply domain includes:
a first input/output circuit connected to a first pad;
a second input/output circuit placed in a direction along one side constituted by a chip end with respect to the first input/output circuit and connected to a second pad; and
a first ESD (Electro-Static-Discharge) protection circuit placed in the vicinity of the first and second input/output circuits on the chip end side,
wherein the first ESD protection circuit includes a first resistor, a first capacitor, a first inverter, and a first N-channel transistor,
wherein the second power supply domain includes a second ESD protection circuit placed in a direction along a chip edge side with respect to the first input/output circuit,
wherein the second ESD protection circuit includes a second resistor, a second capacitor, a second inverter, a second N-channel transistor, and a fourth diode, and
wherein between the first power supply domain and the second power supply domain, a bridge circuit is provided for connecting the first grounding wire and the second grounding wire with each other.

17. The semiconductor device according to claim 16, comprising:
a first power supply wiring connected to a first power supply pad; and
a first grounding wire connected to a first ground pad,
wherein the first and second input/output circuits respectively include a first diode having an anode connected to a signal wiring and a cathode connected to a first power supply wiring, a second diode having an anode connected to a first grounding wire and a cathode connected to the signal wiring, and an output circuit or an input circuit connected to the signal wiring,
wherein one end of the first resistor is connected to the first power supply wiring,
wherein the other end of the first resistor is connected to one end of the first capacitor,
wherein the other end of the first capacitor is connected to the first grounding wire,
wherein the other end of the first resistor is connected to an input of a first inverter,
wherein an output of the first inverter is connected to the gate electrode of a first N-channel transistor, and
wherein the first N-channel transistor is configured such that a current path is formed between the first power supply wiring and the first grounding wire.

18. The semiconductor device according to claim 17, comprising:
  a third diode placed between the first input/output circuit and the second input/output circuit and having an anode connected to the first grounding wire and a cathode connected to the first power supply wiring.
19. The semiconductor device according to claim 17, comprising:
  a bridge circuit connecting the first grounding wire and the second grounding wire with each other,
  wherein the bridge circuit includes a fifth diode having an anode connected to the first grounding wire and a cathode connected to the second grounding wire and a sixth diode having an anode connected to the second grounding wire and a cathode connected to the first grounding wire.
20. The semiconductor device according to claim 16,
  wherein the length of the second power supply domain in a direction along the one side is smaller than the length of the first power supply domain in a direction along the one side.

\* \* \* \* \*